US 12,035,059 B2

United States Patent
Shimada

(10) Patent No.: US 12,035,059 B2
(45) Date of Patent: Jul. 9, 2024

(54) IMAGE PICKUP APPARATUS

(71) Applicant: OLYMPUS CORPORATION, Hachioji (JP)

(72) Inventor: Yoshinao Shimada, Hino (JP)

(73) Assignee: Olympus Corporation, Tokyo (JP)

( * ) Notice: Subject to any disclaimer, the term of this patent is extended or adjusted under 35 U.S.C. 154(b) by 163 days.

(21) Appl. No.: 17/950,054

(22) Filed: Sep. 21, 2022

(65) Prior Publication Data

US 2023/0012537 A1  Jan. 19, 2023

Related U.S. Application Data

(63) Continuation of application No. PCT/JP2020/013789, filed on Mar. 26, 2020.

(51) Int. Cl.
| | | |
|---|---|---|
| *H04N 25/63* | (2023.01) | |
| *H01L 27/146* | (2006.01) | |
| *H04N 25/46* | (2023.01) | |

(52) U.S. Cl.
CPC ....... *H04N 25/63* (2023.01); *H01L 27/14621* (2013.01); *H04N 25/46* (2023.01)

(58) Field of Classification Search
CPC ........ H04N 25/63; H04N 25/46; H04N 23/00; H04N 23/60; H04N 25/42; H04N 25/445; H04N 25/633; H04N 25/704; H04N 25/672; H04N 23/672; H04N 25/441; H04N 25/673; H04N 25/75; H01L 27/14621; G02B 7/34; G03B 13/36
See application file for complete search history.

(56) References Cited

U.S. PATENT DOCUMENTS

| | | | | |
|---|---|---|---|---|
| 2008/0129847 A1* | 6/2008 | Kobayashi | ............. | H04N 25/63 |
| | | | | 348/E9.037 |
| 2015/0381912 A1* | 12/2015 | Ikedo | ..................... | H04N 25/42 |
| | | | | 250/208.1 |

(Continued)

FOREIGN PATENT DOCUMENTS

| | | |
|---|---|---|
| JP | 2009-005061 | 1/2009 |
| JP | 2016-010065 | 1/2016 |

(Continued)

OTHER PUBLICATIONS

International Search Report (ISR) to International Application No. PCT/JP2020/013789, mailed on Jul. 14, 2020 (with translation).

*Primary Examiner* — Lin Ye
*Assistant Examiner* — Tuan H Le
(74) *Attorney, Agent, or Firm* — John C. Pokotylo; Pokotylo Patent Services

(57) ABSTRACT

An image pickup apparatus includes an image sensor including a plurality of normal pixels and OB pixels obtained by dividing each pixel into n, and an image processing circuit. The image sensor can read each pixel row in a first read mode in which a pixel signal is generated and read or in a second read mode in which n signals relating to n divided pixel signals are read in n rows. The image processing circuit performs processing on signals read in the first and second read modes to generate image data and performs OB level correction processing on a normal pixel signal read from the normal pixels in the second read mode using an OB pixel signal read from the OB pixels in the first and second read modes.

18 Claims, 9 Drawing Sheets

(56) References Cited

U.S. PATENT DOCUMENTS

2016/0344962 A1* 11/2016 Hirai .................... H04N 25/778
2017/0142359 A1*  5/2017 Ikedo .................... H04N 25/63
2018/0294306 A1* 10/2018 Sambonsugi ..... H01L 27/14643

FOREIGN PATENT DOCUMENTS

| JP | 2016-092792 | 5/2016 |
| --- | --- | --- |
| JP | 2016-105187 | 6/2016 |
| JP | 2016-220078 | 12/2016 |
| JP | 2017-098931 | 6/2017 |
| JP | 2018-042285 | 3/2018 |

* cited by examiner

FIG. 3

| | PIXEL DIVISION CONFIGURATION | READ CIRCUIT |
|---|---|---|
| RL DIVISION | Rr L / Rr R, Gr L / Gr R, Gb L / Gb R, Bb L / Bb R (PD, ML) | TrRES, TrL (PDL), TrR (PDR), TrAMP, TrSEL, FD, VDD, VSL |
| UD DIVISION | Rr U / Rr D, Gr U / Gr D, Gb U / Gb D, Bb U / Bb D (PD, ML) | TrRES, TrU (PDU), TrD (PDD), TrAMP, TrSEL, FD, VDD, VSL |
| RLUD DIVISION | Rr LU/RU/LD/RD, Gr LU/RU/LD/RD, Gb LU/RU/LD/RD, Bb LU/RU/LD/RD (PD, ML) | TrRES, TrLU (PDLU), TrRU (PDRU), TrLD (PDLD), TrRD (PDRD), TrAMP, TrSEL, FD, VDD, VSL |

FIG. 4

| | | First Column | Second Column | Third Column | Fourth Column | (Last-3)-Th Column | (Last-2)-Th Column | (Last-1)-Th Column | Last Column |
|---|---|---|---|---|---|---|---|---|---|
| FIRST ROW | ALL | Rr | Gr | Rr | Gr | Rr | Gr | Rr | Gr |
| SECOND ROW | ALL | Gb | Bb | Gb | Bb | Gb | Bb | Gb | Bb |
| P-TH ROW | L (LU+LD) | Rr | Gr | Rr | Gr | Rr | Gr | Rr | Gr |
| | R (RU+RD) | Rr | Gr | Rr | Gr | Rr | Gr | Rr | Gr |
| (P+1)-TH ROW | L (LU+LD) | Gb | Bb | Gb | Bb | Gb | Bb | Gb | Bb |
| | R (RU+RD) | Gb | Bb | Gb | Bb | Gb | Bb | Gb | Bb |
| (P+2)-TH ROW | ALL | Rr | Gr | Rr | Gr | Rr | Gr | Rr | Gr |
| (P+3)-TH ROW | ALL | Gb | Bb | Gb | Bb | Gb | Bb | Gb | Bb |
| (LAST-1)-TH ROW | L (LU+LD) | Rr | Gr | Rr | Gr | Rr | Gr | Rr | Gr |
| | R (RU+RD) | Rr | Gr | Rr | Gr | Rr | Gr | Rr | Gr |
| LAST ROW | L (LU+LD) | Gb | Bb | Gb | Bb | Gb | Bb | Gb | Bb |
| | R (RU+RD) | Gb | Bb | Gb | Bb | Gb | Bb | Gb | Bb |

FIG. 5

| | | First Column | Second Column | Third Column | Fourth Column | (Last-3)-Th Column | (Last-2)-Th Column | (Last-1)-Th Column | Last Column |
|---|---|---|---|---|---|---|---|---|---|
| FIRST ROW | ALL | Rr | Gr | Rr | Gr | Rr | Gr | Rr | Gr |
| SECOND ROW | ALL | Gb | Bb | Gb | Bb | Gb | Bb | Gb | Bb |
| P-TH ROW | L (LU+LD) | Rr | Gr | Rr | Gr | Rr | Gr | Rr | Gr |
| | (L+R) (LU+LD+RU+RD) | Rr | Gr | Rr | Gr | Rr | Gr | Rr | Gr |
| (P+1)-TH ROW | L (LU+LD) | Gb | Bb | Gb | Bb | Gb | Bb | Gb | Bb |
| | (L+R) (LU+LD+RU+RD) | Gb | Bb | Gb | Bb | Gb | Bb | Gb | Bb |
| (P+2)-TH ROW | ALL | Rr | Gr | Rr | Gr | Rr | Gr | Rr | Gr |
| (P+3)-TH ROW | ALL | Gb | Bb | Gb | Bb | Gb | Bb | Gb | Bb |
| (LAST-1)-TH ROW | L (LU+LD) | Rr | Gr | Rr | Gr | Rr | Gr | Rr | Gr |
| | (L+R) (LU+LD+RU+RD) | Rr | Gr | Rr | Gr | Rr | Gr | Rr | Gr |
| LAST ROW | L (LU+LD) | Gb | Bb | Gb | Bb | Gb | Bb | Gb | Bb |
| | (L+R) (LU+LD+RU+RD) | Gb | Bb | Gb | Bb | Gb | Bb | Gb | Bb |

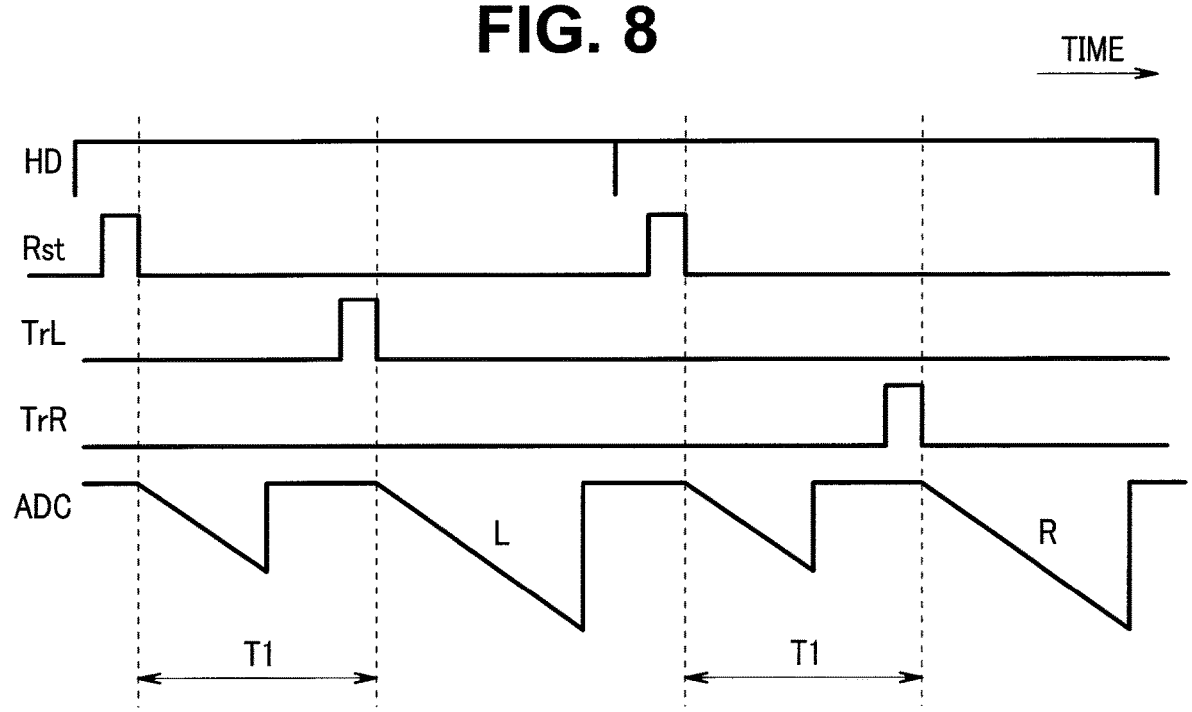
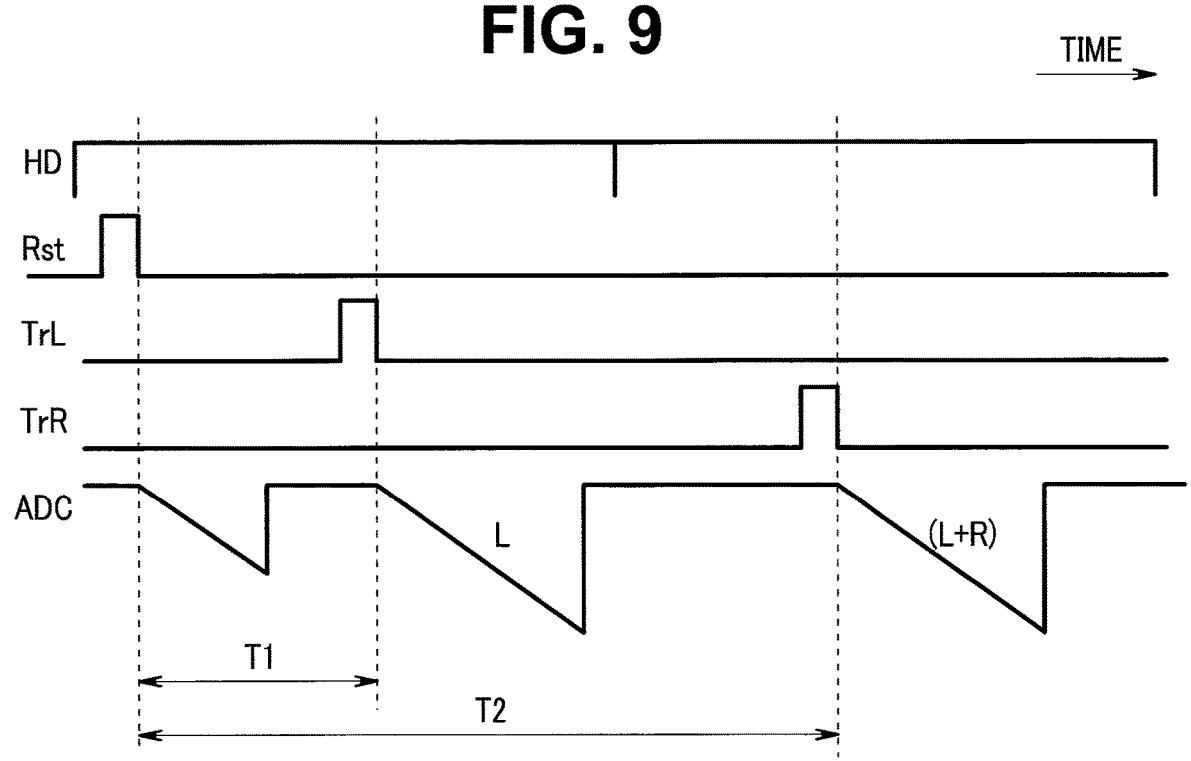

IMAGE PICKUP APPARATUS

CROSS REFERENCE TO RELATED APPLICATION

This application is a continuation application of PCT/JP2020/013789 filed on Mar. 26, 2020, the entire contents of which are incorporated herein by this reference.

BACKGROUND OF THE INVENTION

1. Field of the Invention

The present invention relates to an image pickup apparatus including an image sensor in which a pixel is divided into a plurality of pixels.

2. Description of the Related Art

In recent years, an image pickup apparatus such as a digital camera, in which an image plane phase-difference image sensor is mounted to perform image plane phase-difference AF has been in widespread use. Compared to a contrast AF scheme in related art in which a peak of a contrast value of an acquired image is searched for while a focus position is changed, in image plane phase-difference AF, a drive direction and a necessary drive amount of a focus lens for focusing from a current focus position can be acquired without searching for a peak of a contrast value, so that focusing can be performed at high speed.

The image plane phase-difference image sensor enables detection of a phase difference by performing photoelectric conversion on a light beam subjected to pupil division with a photoelectric conversion element (examples of the photoelectric conversion element can include a photodiode (PD), hereinafter, simply referred to as a PD). The image plane phase-difference image sensor typically includes an image plane phase-difference image sensor employing a shading scheme and an image plane phase-difference image sensor employing a PD division scheme.

The image plane phase-difference image sensor employing a shading scheme is an image plane phase-difference image sensor including a shading structure that blocks part of a light beam incident on a PD disposed under a micro lens within a pixel and performs pupil division on a light beam incident from a taking lens in accordance with arrangement of the shading structure.

On the other hand, the image plane phase-difference image sensor employing a PD division scheme is an image plane phase-difference image sensor that performs pupil division on a light beam incident from a taking lens by dividing a PD within a pixel instead of including a shading structure. The pupil division in the PD division scheme depends on how the PD is divided.

For example, Japanese Patent Application Laid-Open Publication No. 2016-105187 discloses a technique of generating pixel data for left pupil division by averaging part of signals of PDs divided into nine, generating pixel data for right pupil division by averaging the other part, and generating pixel data of RAW data for still image by averaging all.

While in the image plane phase-difference image sensor employing a PD division scheme, a pair (such as a right and left pair and an upper and lower pair) between which a phase difference is detected can be constituted within one pixel, in the image plane phase-difference image sensor employing a shading scheme, the pair cannot be constituted within one pixel and requires a plurality of pixels, and thus, focus detection accuracy of the image plane phase-difference image sensor employing a PD division scheme can be considerably improved compared to the image plane phase-difference image sensor employing a shading scheme.

While the number of PDs of the image plane phase-difference image sensor employing a shading scheme is not different from the number of PDs of a non-image plane phase-difference image sensor, the number of PDs becomes n times in accordance with the number of divisions n of the pixel in the image plane phase-difference image sensor employing a PD division scheme.

SUMMARY OF THE INVENTION

An image pickup apparatus according to one aspect of the present invention includes an image sensor in which a plurality of pixels are arranged in a row direction and in a direction intersecting with the row direction, assuming that n is an integer equal to or greater than 2, each of the plurality of pixels including one micro lens and n photoelectric conversion elements, the plurality of pixels including a normal pixel that is not shaded and an OB pixel that is a shaded optical black pixel, the image sensor being configured to output an image pickup signal relating to n divided pixel signals generated by performing photoelectric conversion on light from the micro lens by the n photoelectric conversion elements, and an image processing circuit configured to perform image processing on the image pickup signal outputted from the image sensor, in which the image sensor can read the image pickup signal relating to the n divided pixel signals for each pixel row including a plurality of pixels arranged in the row direction in a first read mode or a second read mode, the first read mode is a mode in which the n divided pixel signals are added to generate one pixel signal, and one pixel row is read in one row, the second read mode is a mode in which n signals are generated from the n divided pixel signals, and one pixel row is read in n rows, the image pickup signal of the normal pixel is read in the first read mode and the second read mode, and the image pickup signal of the OB pixel is read in the first read mode and the second read mode, the image processing circuit includes a first circuit configured to generate a first pixel data array from a pixel signal in a pixel row read in the first read mode, generate or extract one pixel signal from the n signals in a pixel row read in the second read mode to generate a second pixel data array having an arrangement order of pixel data that is the same as an arrangement order of pixel data of the first pixel data array and generate image data in which pixel data is arranged in a predetermined order for each pixel row, and the first circuit performs OB level correction processing on a normal pixel signal generated or extracted from the n signals read from the normal pixel in the second read mode using an OB pixel signal generated or extracted from the n signals read from the OB pixel in the second read mode and an OB pixel signal read from the OB pixel in the first read mode.

An image pickup apparatus according to one aspect of the present invention includes an image sensor in which a plurality of pixels are arranged in a row direction and in a direction intersecting with the row direction, assuming that n is an integer equal to or greater than 2, each of the plurality of pixels including one micro lens and n photoelectric conversion elements, the image sensor being configured to output an image pickup signal relating to n divided pixel signals generated by performing photoelectric conversion on light from the micro lens by the n photoelectric conversion elements, and an image processing circuit configured to perform image processing on the image pickup signal outputted from the image sensor, in which the image sensor can read the image pickup signal relating to the n divided pixel signals for each pixel row including a plurality of pixels arranged in the row direction in the first read mode or the second read mode, the first read mode is a mode in which the n divided pixel signals are added to generate one pixel signal, and one pixel row is read in one row, the second read mode is a mode in which n signals are generated from the n divided pixel signals, and one pixel row is read in n rows, the image processing circuit includes a first circuit configured to generate a first pixel data array from a pixel signal in a pixel row read in the first read mode, generate or extract one pixel signal from the n signals in a pixel row read in the second read mode to generate a second pixel data array having an arrangement order of pixel data that is the same as an arrangement order of pixel data of the first pixel data array and generate image data in which pixel data is arranged in a predetermined order for each pixel row, and a second circuit configured to perform dark shading correction on the image data, and the second circuit subtracts dark shading data in accordance with a pixel position from each piece of pixel data of the first pixel data array generated by the first circuit and subtracts data obtained by multiplying the dark shading data in accordance with the pixel position by n times from each piece of pixel data of the second pixel data array generated by the first circuit.

An image pickup apparatus according to one aspect of the present invention includes an image sensor in which a plurality of pixels are arranged in a row direction and in a direction intersecting with the row direction, assuming that n is an integer equal to or greater than 4, each of the plurality of pixels including one micro lens and n photoelectric conversion elements, the plurality of pixels including a normal pixel that is not shaded and an OB pixel that is a shaded optical black pixel, the image sensor being configured to output an image pickup signal relating to n divided pixel signals generated by performing photoelectric conversion on light from the micro lens by the n photoelectric conversion elements, and an image processing circuit configured to perform image processing on the image pickup signal outputted from the image sensor, in which the image sensor can read the image pickup signal relating to the n divided pixel signals for each pixel row including a plurality of pixels arranged in the row direction in the first read mode or the second read mode, the first read mode is a mode in which the n divided pixel signals are added to generate one pixel signal and one pixel row is read in one row, the second read mode is a mode in which m ($2 \le m < n$) signals are generated from the n divided pixel signals and one pixel row is read in m rows, the image pickup signal of the normal pixel is read in the first read mode and the second read mode, and the image pickup signal of the OB pixel is read in the first read mode and the second read mode, the image processing circuit includes a first circuit configured to generate a first pixel data array from a pixel signal in a pixel row read in the first read mode, generate or extract one pixel signal from the m signals in a pixel row read in the second read mode to generate a second pixel data array having an arrangement order of pixel data that is the same as an arrangement order of pixel data of the first pixel data array and generate image data in which pixel data is arranged in a predetermined order for each pixel row, and the first circuit performs OB level correction processing on a normal pixel signal generated or extracted from the m signals read from the normal pixel in the second read mode using an OB pixel signal generated or extracted from the m signals read from the OB pixel in the second read mode and an OB pixel signal read from the OB pixel in the first read mode.

BRIEF DESCRIPTION OF THE DRAWINGS

FIG. 3 is a diagram illustrating an example of a pixel division configuration and a read circuit in a case of division in two and in a case of division in four in an image sensor in the above-described embodiment;

FIG. 4 is a view illustrating part of image data read from the image sensor in the above-described embodiment using a normal read scheme and sorted by a sorting circuit;

FIG. 5 is a view illustrating part of image data read from the image sensor in the above-described embodiment using an addition read scheme and sorted by the sorting circuit;

FIG. 8 is a timing chart indicating action of a read circuit in a 2PD region using the normal read scheme in the image sensor in the above-described embodiment;

FIG. 9 is a timing chart indicating action of the read circuit in the 2PD region in the image sensor using the addition read scheme in the above-described embodiment;

DETAILED DESCRIPTION OF THE PREFERRED EMBODIMENTS

Embodiments of the present invention will be described below with reference to the drawings.

Figure 1:
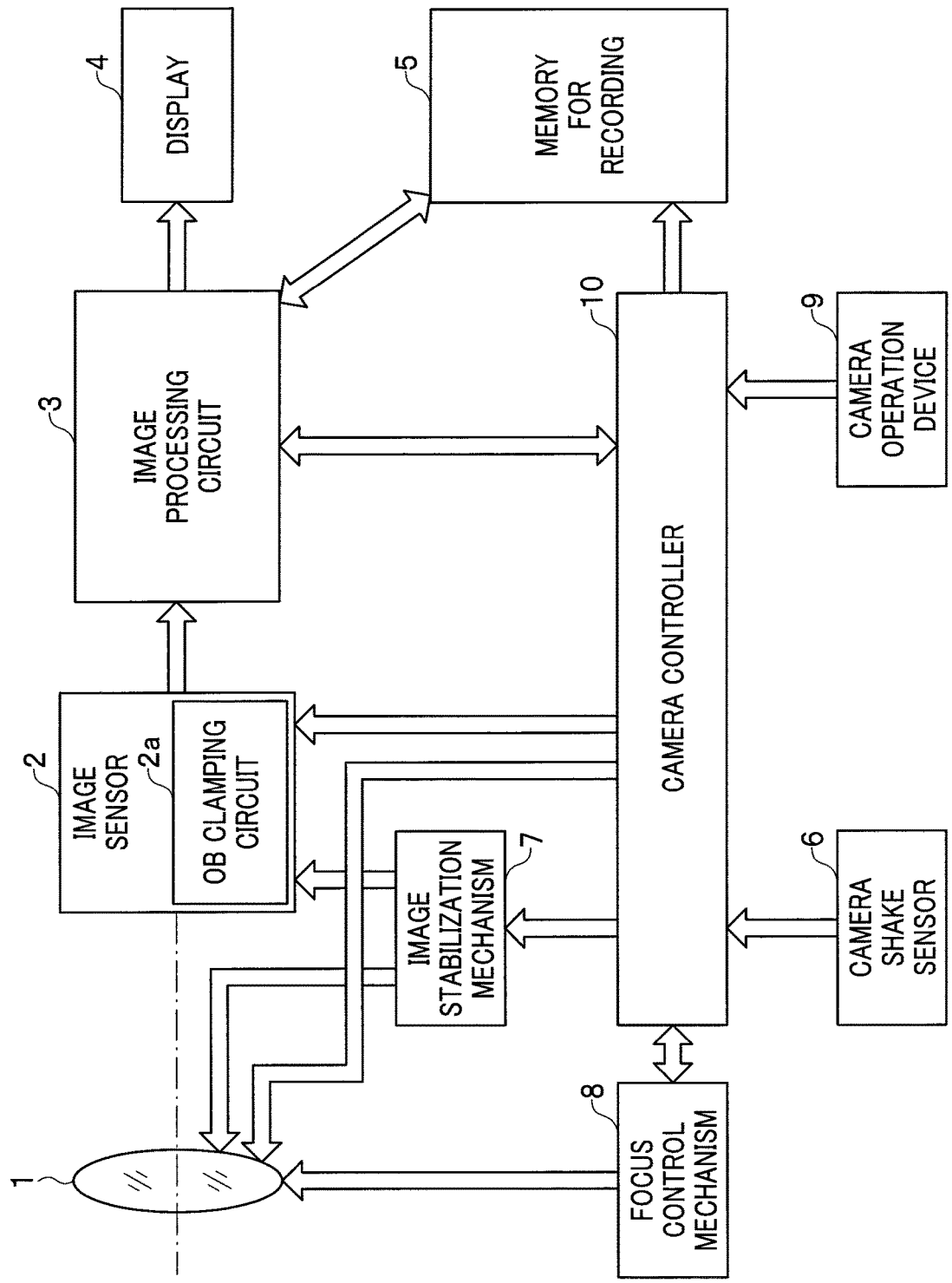
FIG. 1 is a block diagram illustrating a configuration of an image pickup apparatus in one embodiment of the present invention.

FIG. 1 to FIG. 15 illustrate one embodiment of the present invention, and FIG. 1 is a block diagram illustrating a configuration of an image pickup apparatus.

Note that while FIG. 1 illustrates an example where the image pickup apparatus is constituted as, for example, a digital camera, the image pickup apparatus is not limited to a digital camera and can be any of various kinds of apparatuses having a photographing function, such as a digital video camera, a telephone apparatus having a photographing function, an electronic endoscope, a microscope having a photographing function, and a telescope having a photographing function.

As illustrated in FIG. 1, the image pickup apparatus includes a lens 1, an image sensor 2, an image processing circuit 3, a display 4, a camera shake sensor 6, an image stabilization mechanism 7, a focus control mechanism 8, a camera operation device 9 and a camera controller 10. Note that while FIG. 1 also illustrates a memory 5 for recording, the memory 5 for recording may be constituted to be attachable/detachable to/from the image pickup apparatus, and thus, does not have to be a component specific to the image pickup apparatus.

The lens 1 is an image pickup optical system that forms an optical image of an object at the image sensor 2. The lens 1 includes one or more lenses including a focus lens for adjusting a focus position to perform focusing and an aperture for controlling a range of a passing light flux, and in the present embodiment, further includes an image stabilization function.

Note that while not illustrated, a mechanical shutter for controlling an exposure period is further provided, for example, between the lens 1 and the image sensor 2.

The image sensor 2, which is disposed on an optical path of a photographing optical axis of the lens 1, performs photoelectric conversion on the optical image of the object formed by the lens 1 to obtain an image pickup signal that is an electrical signal and outputs the image pickup signal.

In the image sensor 2, a plurality of pixels are arranged in a row direction and in a direction intersecting with the row direction. While examples of the direction intersecting with the row direction can include a direction (column direction) orthogonal to the row direction as one example, the direction is not limited to the direction orthogonal to the row direction and may be a direction oblique to the row direction (for example, arrangement of a so-called honeycomb structure), or the like.

Assuming that n is an integer equal to or greater than 2, each of a plurality of pixels provided at the image sensor 2 includes one micro lens ML (see FIG. 3) and n photoelectric conversion elements PDs (see FIG. 3). Note that a typical optical lens normally includes a plurality of lenses constituted in an optical axis direction. Thus, also a micro lens ML including a plurality of lenses constituted in an optical axis direction will be counted as one micro lens ML.

Further, the image sensor 2 outputs an image pickup signal relating to n divided pixel signals generated by performing photoelectric conversion on light from the micro lens ML by the n photoelectric conversion elements PD.

Here, examples of the image pickup signal relating to the n divided pixel signals can include, in a case where one pixel is divided into two of L (left) and R (right), n divided pixel signals per se (a divided pixel signal L and a divided pixel signal R), signals that can constitute the n divided pixel signals (a pixel signal (L+R) and the divided pixel signal L) (or the pixel signal (L+R) and the divided pixel signal R), pixel signals obtained by adding the n divided pixel signals (the pixel signal (L+R) from a 2PD region, a pixel signal ALL from a 1PD region), and the like.

The image sensor 2 is a color image sensor in which color filters of a plurality of filter colors are arranged as repetition of a predetermined basic array so that one micro lens ML corresponds to one filter color. However, the image sensor 2 is not limited to a color image sensor and may be a monochrome image sensor.

While examples of the predetermined basic array of the image sensor 2 can include, for example, a Bayer array of 2×2 pixels (such as a primary color Bayer array and a complementary color Bayer array), the predetermined basic array is not limited to the Bayer array and may be a basic array of 6×6 pixels, and the like. In the present embodiment, a case will be described where the predetermined basic array is the primary color Bayer array.

In this manner, the image sensor 2 is a so-called image plane phase-difference image sensor employing a PD division scheme, in which a pixel is divided into a plurality of divided pixels.

Here, FIG. 3 is a diagram illustrating an example of a pixel division configuration and a read circuit in a case of division into two and in a case of division into four in the image sensor 2.

The primary color Bayer array is an array in which a basic array of 2×2 pixels is periodically repeated in a row direction and in a column direction. The basic array of the primary color Bayer array is an array in which green filters Gr and Gb are disposed at diagonal positions, a red filter Rr is disposed in the same row as the row of the green filter Gr, and a blue filter Bb is disposed in the same row as the row of the green filter Gb.

Here, while the green filter Gr and the green filter Gb have the same spectroscopic characteristics, the green filter Gr and the green filter Gb are distinguished from each other in accordance with whether the row of the filter is the same as the row of the red filter Rr or the row of the blue filter Bb. Note that to distinguish from R of left (L) and right (R), red of the filter color is described as Rr, and blue is described as Bb in a similar manner.

Further, one pixel includes a color filter of any one of four filter colors of Rr, Gr, Gb and Bb, and one micro lens ML. Here, while a non-image plane phase-difference image sensor (or an image plane phase-difference image sensor employing a shading scheme) employs a configuration where one pixel corresponds to one photoelectric conversion element PD, the image sensor 2 of the present embodiment, which is an image plane phase-difference image sensor employing a PD division scheme employs a configuration where one pixel includes n photoelectric conversion elements PD in accordance with the number of divisions n of the pixel.

Further, a plurality of pixels provided in the image sensor 2 include a normal pixel with no light shielding film and not shaded, and an OB (optical black) pixel that is a shaded pixel in which a light shielding film, or the like, is formed on an entire surface on a light receiving portion of the pixel. An arrangement example of the normal pixel and the OB pixel will be described later with reference to FIG. 6.

A first field of FIG. 3 indicates an example where one pixel is divided into two of a right portion (R) and a left portion (L). Note that in FIG. 3, rows of the table are sequentially referred to as a first field to a third field from top to bottom.

Here, arrangement of the n photoelectric conversion elements PD for one micro lens ML will be referred to as division arrangement. In this event, division arrangement indicated in the first field includes two types (n=2) of left (L) and right (R). The RL division arrangement is appropriate for phase-difference detection in a lateral direction (so-called vertical line detection).

Further, the two photoelectric conversion elements PD in the division arrangement, that is, a left photoelectric conversion element PDL and a right photoelectric conversion element PDR are respectively provided for each of the pixels of the filter colors Rr, Gr, Gb and Bb. The photoelectric conversion elements PDL and PDR are constituted as, for example, photodiodes and photoelectrically convert incident light to generate charges.

The photoelectric conversion elements PDL and PDR are connected to a floating diffusion FD respectively by way of transistors TrL and TrR that function as read switches.

In such a configuration, if one or more of the transistors TrL and TrR are turned on, a charge of the photoelectric conversion element PD connected to the transistor Tr that is turned on is transferred to the floating diffusion FD.

Thus, by turning on only one of the transistors TrL and TrR, the charge of one of the photoelectric conversion elements PDL and PDR is transferred to the floating diffusion FD, and a divided pixel signal L or a divided pixel signal R can be read as will be described later.

Further, by turning on the two transistors TrL and TrR, the charges of the photoelectric conversion elements PDL and PDR are transferred to the floating diffusion FD, that is, the charges of the two photoelectric conversion elements PDL and PDR are added, and a normal (L+R) pixel signal can be read.

The floating diffusion FD and the transistors TrL and TrR are connected to a power supply voltage VDD by way of a transistor TrRES that functions as a reset switch. As a result of the transistor TrRES being turned on, the floating diffusion FD is reset. In this event, further, by turning on the transistors TrL and TrR at the same time, the respective photoelectric conversion elements PDL and PDR are also reset.

The floating diffusion FD is connected to a vertical signal line VSL by way of a transistor TrAMP and a transistor TrSEL. Here, the transistor TrAMP is connected to the power supply voltage VDD and connected to a constant current circuit (not illustrated) by way of the transistor TrSEL and functions as an amplification circuit, and the transistor TrSEL functions as a select switch.

Further, by turning on the transistor TrSEL, a voltage value of the floating diffusion FD is amplified by the transistor TrAMP and read from the vertical signal line VSL.

Next, the second field of FIG. 3 indicates an example where one pixel is divided into two of an upper portion (U) and a lower portion (D).

In other words, division arrangement indicated in the second field includes two types (n=2) of the upper portion (U) and the lower portion (D). The UD division arrangement is appropriate for phase-difference detection in a longitudinal direction (so-called horizontal line detection).

Further, the two photoelectric conversion elements PD in the division arrangement, that is, an upper photoelectric conversion element PDU and a lower photoelectric conversion element PDD are respectively provided for each of the pixels of the filter colors Rr, Gr, Gb and Bb. The respective photoelectric conversion elements PDU and PDD are constituted as, for example, photodiodes and photoelectrically convert incident light to generate charges.

Note that the read circuit is similar to the read circuit in a case where the pixel is divided into two of R and L except a point that the LR become UD.

Further, by turning on one of transistors TrU and TrD, a U divided pixel signal or a D divided pixel signal can be read.

On the other hand, by turning on the two transistors TrU and TrD, charges of the two photoelectric conversion elements PDU and PDD are added, and a normal (U+D) pixel signal can be read.

Subsequently, the third field of FIG. 3 indicates an example where one pixel is divided into four of a right portion (R), a left portion (L), an upper portion (U) and a lower portion (D).

Division arrangement indicated in the third field includes four types (n=4) of an upper left portion (LU), an upper right portion (RU), a lower left portion (LD) and a lower right portion (RD). The four division arrangement is appropriate for both phase-difference detection in a lateral direction (so-called vertical line detection) and phase-difference detection in a longitudinal direction (so-called horizontal line detection).

Further, the four photoelectric conversion elements PD in the division arrangement, that is, an upper left photoelectric conversion element PDLU, an upper right photoelectric conversion element PDRU, a lower left photoelectric conversion element PDLD, and a lower right photoelectric conversion element PDRD are respectively provided for each of the pixels of the filter colors Rr, Gr, Gb and Bb. The photoelectric conversion elements PDLU, PDRU, PDLD and PDRD are constituted as, for example, photodiodes and photoelectrically convert incident light to generate charges.

The photoelectric conversion elements PDLU, PDRU, PDLD and PDRD are connected to the floating diffusion FD respectively by way of the transistors TrLU, TrRU, TrLD and TrRD that function as read switches.

In such a configuration, by turning on one or more of the transistors TrLU, TrRU, TrLD and TrRD, charges of the photoelectric conversion elements PD connected to the transistors Tr that are turned on are transferred to the floating diffusion FD.

Thus, by turning on only one of the transistors TrLU, TrRU, TrLD and TrRD, a charge of one of the photoelectric conversion elements PDLU, PDRU, PDLD and PDRD is transferred to the floating diffusion FD and can be read as an LU divided pixel signal, an RU divided pixel signal, an LD divided pixel signal or an RD divided pixel signal.

Further, by turning on two or more of the transistors TrLU, TrRU, TrLD and TrRD, charges of two or more of the photoelectric conversion elements PDLU, PDRU, PDLD and PDRD are transferred to the floating diffusion FD, that is, the charges of the two or more photoelectric conversion elements PD can be added and read.

Thus, for example, by performing UD addition, an L (LU+LD) divided pixel signal and an R (RU+RD) divided pixel signal can be read. A case where such a read method is employed can be dealt with as a case where one pixel is divided into two of RL (n=2).

Further, for example, by performing RL addition, a U (LU+RU) divided pixel signal and a D (LD+RD) divided pixel signal can be read. A case where such a read method is employed can be dealt with as a case where one pixel is divided into two of UD (n=2).

Further, for example, by performing RLUD addition, a normal (LU+RU+LD+RD) pixel signal can be read.

In addition, a divided pixel signal obtained by adding three among the pixels divided into four of RLUD (specifically, LU+RU+LD, LU+RU+RD, LU+LD+RD, RU+LD+RD) can be read.

The floating diffusion FD and the transistors TrLU, TrRU, TrLD and TrRD are connected to the power supply voltage VDD by way of the transistor TrRES that functions as a reset switch. By turning on the transistor TrRES, the floating diffusion FD is reset. In this event, further, by turning on the transistors TrLU, TrRU, TrLD and TrRD at the same time, the photoelectric conversion elements PDLU, PDRU, PDLD and PDRD are also reset.

The floating diffusion FD is connected to the vertical signal line VSL by way of the transistor TrAMP that is connected to the power supply voltage VDD, connected to a constant current circuit (not illustrated) by way of the transistor TrSEL and functions as an amplification circuit, and the transistor TrSEL that functions as a select switch.

Then, by turning on the transistor TrSEL, a voltage value of the floating diffusion FD is amplified by the transistor TrAMP and can be read from the vertical signal line VSL.

If all the divided pixels within the pixel are added to generate a pixel signal and the pixel signal is read from such an image plane phase-difference image sensor employing a PD division scheme (which will be referred to as a video read mode as appropriate), reading can be performed in a read period similar to a read period in a case where a pixel signal is read from a normal image sensor in which a pixel is not divided, but phase difference information cannot be obtained.

On the other hand, if all divided pixels are read from the image plane phase-difference image sensor employing a PD division scheme (which will be referred to as an all phase-difference read mode), it takes, in a case of division in two, a read period which is about twice a period that is required for adding divided pixels to generate a pixel signal and reading the pixel signal and, in a case of division in four, it takes a read period which is about four times the period, which degrades an image pickup rate.

Thus, the image sensor 2 of the present embodiment can read the image pickup signal relating to the n divided pixel signals in the first read mode or the second read mode (reads certain pixel rows in the first read mode and reads other pixel rows in the second read mode) for each pixel row including a plurality of pixels arranged in a row direction. Such a read mode will be referred to as a high-speed video phase-difference read mode as appropriate.

In the high-speed video phase-difference read mode, the image sensor 2 reads an image pickup signal of a normal pixel in the first read mode and the second read mode (reads certain normal pixel rows in the first read mode and reads the other normal pixel rows in the second read mode) and reads an image pickup signal of an OB pixel in the first read mode and the second read mode (reads certain OB pixel rows in the first read mode and reads the other OB pixel rows in the second read mode).

Here, the first read mode is a read mode in which n divided pixel signals are added to generate one pixel signal and one pixel row is read in one row. In the first read mode, a pixel signal equivalent to a state where one pixel is constituted with only one photoelectric conversion element PD (in other words, not divided) is outputted, and thus, the read mode will be described as "1PD" as appropriate.

Further, the second read mode is a read mode in which n signals are generated from the n divided pixel signals, and one pixel row is read in n rows or less natural number (integer equal to or greater than 1) rows. While the second read mode includes two types of a normal read scheme and an addition read scheme as will be described later, regardless of the scheme that is used for reading, n or less natural number (integer equal to or greater than 1) signals are outputted, and thus, the read mode will be described as "kPD" using the number of read rows, where k is a natural number (integer equal to or greater than 1) and is a value equal to or less than n (in a case of division into two, and in a case where k=n, "2PD") as appropriate.

By providing both pixel rows read in the first read mode and pixel rows read in the second read mode, it is possible to also acquire phase difference information while preventing decrease in an image pickup rate.

Note that while the image sensor 2 of the present embodiment can operate in the video read mode and the all phase-difference read mode described above, in the following description, a case will be described where the image sensor 2 operates in the high-speed video phase-difference read mode.

The image pickup signal read from the read circuit is converted into a digital signal by a column parallel A/D converter (so-called column ADC) (not illustrated) provided within the image sensor 2, and an OB level is set at a predetermined target level (OB clamping level) (fixed value) by an OB clamping circuit 2a provided within the image sensor 2. Here, the number of the column ADCs and the number of the OB clamping circuits 2a are not limited to one, there is a case where a plurality of column ADCs and OB clamping circuits 2a are provided for improving read speed, and the like.

The image processing circuit 3 receives input of the image pickup signal (image pickup signal relating to the n divided pixel signals generated by the n photoelectric conversion elements PD) outputted from the image sensor 2, performs various kinds of image processing on the inputted signal and generates an image signal for display or for recording.

The display 4 is a display device that displays an image on the basis of the signal subjected to image processing for display by the image processing circuit 3. The display 4 performs live view display, rec view display of a still image after photographing, reproduction display of a recorded still image, display during recording of a moving image, reproduction display of a recorded movie, and the like, and also displays various kinds of information, and the like, relating to the image pickup apparatus.

The memory 5 for recording stores a signal (such as a still image signal and a movie signal) subjected to image processing for recording by the image processing circuit 3 and is constituted with, for example, a memory card attachable/detachable to/from the image pickup apparatus or a non-volatile memory provided inside the image pickup apparatus, or the like.

The camera shake sensor 6 is a sensing device that is constituted with an acceleration sensor, an angular velocity sensor, or the like, detects camera shake of the image pickup apparatus and outputs the camera shake to the camera controller 10.

The image stabilization mechanism 7 is a mechanical mechanism that moves at least one of the lens 1 or the image sensor 2 by an actuator, or the like, so that the camera shake detected by the camera shake sensor 6 is canceled out on the basis of control by the camera controller 10 and prevents influence of camera shake on an optical object image formed at the image sensor 2.

The focus control mechanism 8 is a mechanical mechanism that drives a focus lens included in the lens 1 on the basis of control by the camera controller 10 so that the object image formed at the image sensor 2 is brought into focus. Further, the focus control mechanism 8 outputs lens drive information such as a lens position to the camera controller 10.

The camera operation device 9 is an input device for performing various kinds of operation on the image pickup apparatus. The camera operation device 9 includes operation members such as a power supply switch for powering on/off the image pickup apparatus, a release button for inputting an instruction of still image photographing or moving image shooting, a mode button for setting a still image photographing mode, a moving image shooting mode, a live view mode, a still image/moving image reproduction mode, and the like, an operation button for setting a type of a file to be recorded (such as a JPEG image file, a RAW image file or a combination of the JPEG image file and the RAW image file).

The camera controller 10 controls the whole of the image pickup apparatus including the lens 1, the image sensor 2, the image processing circuit 3, the memory 5 for recording, the image stabilization mechanism 7, the focus control mechanism 8, and the like, on the basis of information from the image processing circuit 3 (including information on an exposure level, contrast, a phase difference, and the like, as will be described later), camera shake information from the camera shake sensor 6, lens drive information from the focus control mechanism 8, input from the camera operation device 9, and the like.

For example, the camera controller 10 controls driving of the image sensor 2 to cause the image sensor 2 to picks up an image. Further, the camera controller 10 controls an aperture of the lens 1 on the basis of information on an exposure level.

Still further, the camera controller 10 controls the focus control mechanism 8 on the basis of information on contrast or a phase difference and drives the focus lens of the lens 1 to cause the focus lens to perform auto focus through contrast AF or phase-difference AF.

Figure 2:
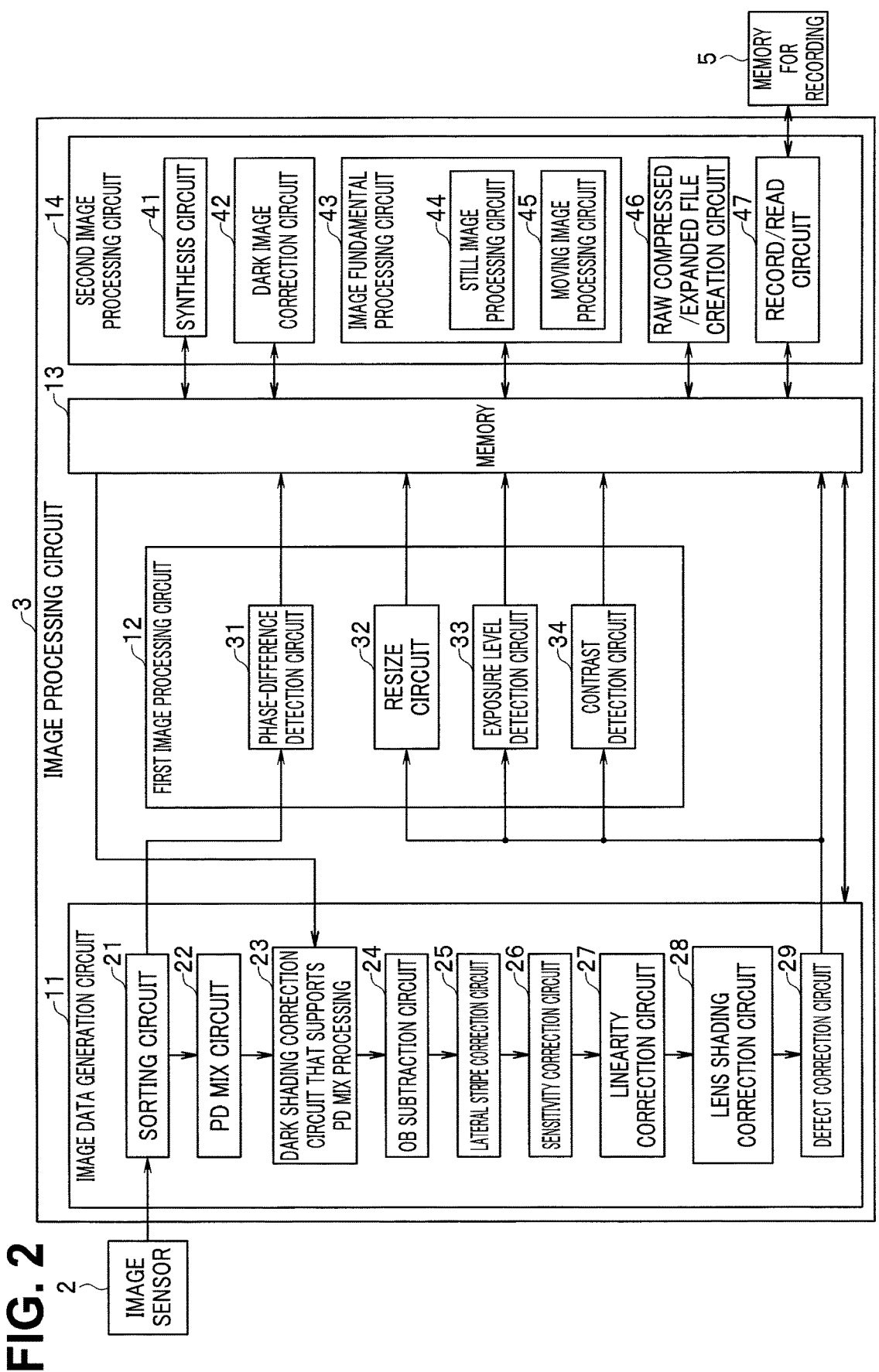
FIG. 2 is a block diagram illustrating a configuration of an image processing circuit in the above-described embodiment.

Next, FIG. 2 is a block diagram illustrating a configuration of the image processing circuit 3.

The image processing circuit 3 includes an image data generation circuit 11, a first image processing circuit 12, a memory 13, and a second image processing circuit 14.

The image data generation circuit 11 performs correction processing, or the like, in accordance with characteristics of the image sensor on the image pickup signal outputted from the image sensor 2 to generate image data.

The first image processing circuit 12 performs processing relating to resizing, AE (autoexposure), AF (autofocus) on the basis of a signal outputted from the image data generation circuit 11.

The memory 13 is a frame memory that stores image data that is processed or being processed by the image data generation circuit 11, the first image processing circuit 12 and the second image processing circuit 14 and includes, for example, a volatile storage portion such as a RAM (random access memory) and a non-volatile storage portion such as an FROM (flash ROM: flash memory (registered trademark)). Here, typically, various kinds of data stored in the non-volatile storage portion are transferred to the volatile storage portion and used for various kinds of processing. Further, there can be a case where data in the volatile storage portion is transferred to the non-volatile storage portion to be held for a relatively long period or also during power-off, because typically, the volatile storage portion can perform operation at high speed and can be easily constituted to have large capacity at low cost.

The camera controller 10 can also access the memory 13, so that information stored in the memory 13 can be read by the camera controller 10 or the camera controller 10 can store information in the memory 13.

As a specific example, the memory 13 temporarily stores the image data generated by the image data generation circuit 11.

Further, the memory 13 stores temporarily or in a non-volatile manner, a shading image for correction to be referred to when a dark shading correction circuit 23 that supports PD mix processing which will be described later of the image data generation circuit 11 performs dark shading correction.

In addition, the memory 13 stores temporarily or in a non-volatile manner, lens shading data to be referred to when a lens shading correction circuit 28 which will be described later of the image data generation circuit 11 performs lens shading correction.

The second image processing circuit 14 performs image processing on the image data generated by the image data generation circuit 11.

The image data generation circuit 11 includes a sorting circuit 21, a PD mix circuit 22, the dark shading correction circuit 23 that supports PD mix processing, an OB subtraction circuit 24, a lateral stripe correction circuit 25, a sensitivity correction circuit 26, a linearity correction circuit 27, a lens shading correction circuit 28 and a defect correction circuit 29.

The sorting circuit 21 processes a pixel signal in a pixel row read in the first read mode and n signals in a pixel row read in the second read mode to generate image data in which pixel data is arranged in a predetermined order for each pixel row.

An output order of the image pickup signals from the image sensor 2 is not limited to a line (row) order in accordance with pixel arrangement on the image sensor 2. For example, in a case where a plurality of column ADCs are provided in the image sensor 2, a plurality of lines are parallelly read at the same time. Thus, the sorting circuit 21 sorts the image pickup signals sequentially outputted from the image sensor 2 to be in an order appropriate for processing by respective circuits in subsequent stages within the image data generation circuit 11.

The PD mix circuit 22 is a first circuit that generates a first pixel data array in the image data from the pixel signal in the pixel row read in the first read mode and generates or extracts one pixel signal from n signals in the pixel row read in the second read mode to generate a second pixel data array in the image data. Here, an arrangement order of the pixel data in the first pixel data array is the same as an arrangement order of the pixel data in the second pixel data array.

Specifically, the PD mix circuit 22 generates or extracts a pixel signal from the divided pixel signals included in the image pickup signals sorted by the sorting circuit 21 and outputs the pixel signal (PD mix processing). Thus, the respective circuits disposed subsequent to the PD mix circuit 22 within the image data generation circuit 11 process image data (so-called RAW image data) including only the pixel signal (in other words, not including the divided pixel signal). By this means, except the dark shading correction circuit 23 that supports PD mix processing which will be described later, a typical processing circuit can be used, so that it is possible to reduce cost.

The dark shading correction circuit 23 that supports PD mix processing is a second circuit that performs dark shading correction on the image data.

The dark shading correction circuit 23 that supports PD mix processing reads the shading image for correction from the memory 13, subtracts an OB clamping level from the shading image for correction to generate dark shading data. Then, the dark shading correction circuit 23 that supports PD mix processing performs dark shading correction by subtracting the dark shading data in accordance with a pixel position from the pixel signal.

More properly, as will be described later with reference to FIG. 14 and FIG. 15, the dark shading correction circuit 23 that supports PD mix processing subtracts the dark shading data in accordance with a pixel position from each piece of pixel data in the first pixel data array generated by the PD mix circuit 22 and subtracts data obtained by multiplying the dark shading data in accordance with the pixel position by n times from each piece of pixel data in the second pixel data array generated by the PD mix circuit 22.

Note that dark shading correction by the dark shading correction circuit 23 that supports PD mix processing is performed for each filter color.

The OB subtraction circuit 24 performs processing of subtracting the OB level for each filter color on the image data outputted from the dark shading correction circuit 23 that supports PD mix processing.

The lateral stripe correction circuit 25 corrects a stripe (random stripe) randomly generated on the image in units in which the read circuit performs operation (for example, in units of one row).

The sensitivity correction circuit 26 corrects sensitivity of the respective pixel signals of the image data for each filter color.

The linearity correction circuit 27 corrects linearity of the respective pixel signals of the image data for each filter color.

The lens shading correction circuit 28 performs lens shading correction on the respective pixel signals of the image data for each filter color on the basis of lens shading data in accordance with a pixel position.

The defect correction circuit 29 corrects a defect pixel signal included in the image data on the basis of a normal pixel signal around the defect pixel signal. Here, the defect correction circuit 29 performs defect pixel correction for each filter color. The image data generated by the defect correction circuit 29 is stored in the memory 13.

The first image processing circuit 12 includes a phase-difference detection circuit 31, a resize circuit 32, an exposure level detection circuit 33 and a contrast detection circuit 34.

The phase-difference detection circuit 31 detects phase difference information from the divided pixel signals included in the image pickup signals sorted by the sorting circuit 21. Then, the phase-difference detection circuit 31 causes the detected phase difference information to be stored in the memory 13. Here, the detected phase difference information is read from the memory 13 by the camera controller 10 and used as information for image plane phase-difference AF. In other words, the camera controller 10 determines a drive direction and a necessary drive amount of the focus lens on the basis of the image plane phase-difference AF information and drives the focus lens of the lens 1 by the focus control mechanism 8.

Note that a scheme of reading the divided pixel signals from the image sensor 2 in the second read mode includes, for example, two schemes of a normal read scheme and an addition read scheme as will be described with reference to FIG. 8 and FIG. 9.

Taking an example of a case where one pixel is divided into two of an L divided pixel and an R divided pixel, the normal read scheme is a scheme in which a divided pixel signal L generated from the L divided pixel and a divided pixel signal R generated from the R divided pixel are respectively read. In a case of division into n, the image sensor 2 reads n divided pixel signals in n rows in the second read mode. Further, as will be described later with reference to FIG. 4, the image sensor 2 can generate m (m<n) signals from the n divided pixel signals and read the m signals in m rows in the normal read scheme in the second read mode. Specifically, in a case of division into four, there can be an example where a signal (LU+LD) and a signal (RU+RD) are read in two rows. In this case, a pixel signal (LU+LD+RU+RD) can be generated by adding the signal (LU+LD) and the signal (RU+RD). Further, the phase-difference detection circuit 31 can detect a phase difference corresponding to a division direction of L and R using the signal (LU+LD) and the signal (RU+RD).

On the other hand, the addition read scheme is a scheme in which one pixel signal obtained by adding n divided pixel signals and (n−1) signals from which n divided pixel signals can be generated by being combined with one pixel signal are read in n rows. Further, as will be described later with reference to FIG. 5, the image sensor 2 can also generate m (m<n) signals from the n divided pixel signals and read the m signals in m rows in the addition read scheme in the second read mode. It is also possible to employ a scheme in which one pixel signal obtained by adding the n divided pixel signals, and (m−1) signals from which m signals can be generated by performing calculation by being combined with one pixel signal are read in m rows. Here, m is an integer less than n and equal to or greater than 1.

Specifically, in a case of division into two, the addition read scheme is a scheme in which one divided pixel signal and a signal obtained by adding two divided pixel signals are read in two rows. For example, in a case of division into two of right and left, a divided pixel signal L and a pixel signal (L+R) are read in two rows or a divided pixel signal R and the pixel signal (L+R) are read in two rows. In this case, the divided pixel signal R (or L) can be generated by subtracting the divided pixel signal L (or R) from the pixel signal (L+R).

Further, in a case of the addition read scheme in division into four, there can be an example where a divided pixel signal LU, a signal (LU+RU), a signal (LU+RU+LD) and a pixel signal (LU+RU+LD+RD) are read in four rows. In this case, a divided pixel signal RD can be generated by subtracting the signal (LU+RU+LD) from the pixel signal (LU+RU+LD+RD), a divided pixel signal LD can be generated by subtracting the signal (LU+RU) from the signal (LU+RU+LD), and a divided pixel signal RU can be generated by subtracting the divided pixel signal LU from the signal (LU+RU). Further, in a case of the addition read scheme in division into four, there can be an example where a signal (LU+LD) and a pixel signal (LU+LD+RU+RD) are read in two rows. In this case, a signal (RU+RD) can be generated by subtracting the signal (LU+LD) from the pixel signal (LU+LD+RU+RD). The phase-difference detection circuit 31 can detect a phase difference corresponding to a division direction of L and R using the signal (LU+LD) and the signal (RU+RD). However, if the number of divisions increases, various methods can be employed as the addition read scheme, and thus, only one example has been described here.

Thus, in a case of the addition read scheme, the phase-difference detection circuit 31 restores a divided pixel signal necessary for phase-difference detection and detects a phase difference.

The resize circuit 32 performs resize processing on image data (RAW image data) in a Bayer format. Here, the image data subjected to resize processing is, for example, used for rec view or thumbnail when a still image is generated or used for changing an aspect and an image size of the image from the image sensor 2 when a movie is generated or a live view image is generated. As a result, a processing bandwidth of a system can be optimized when the processing in the subsequent stages is performed.

The exposure level detection circuit 33 detects an exposure level for controlling exposure of the image sensor 2 on the basis of the RAW image data. Then, the exposure level detection circuit 33 causes the detected exposure level to be stored in the memory 13. Here, the detected exposure level is read from the memory 13 by the camera controller 10 and used as information for autoexposure control (AE). Then, the camera controller 10 performs AE calculation on the basis of the exposure level, drives the aperture of the lens 1 on the basis of the calculation result, adjusts a signal amplification factor (so-called ISO sensitivity) of the image sensor 2 (or the image processing circuit 3) and controls an exposure period by an electronic shutter (or a mechanical shutter (not illustrated)) of the image sensor 2.

The contrast detection circuit 34 detects contrast of the RAW image data. Further, the contrast detection circuit 34 causes the detected contrast to be stored in the memory 13. Here, the detected contrast is read from the memory 13 by the camera controller 10 and used as information for contrast AF. In other words, the camera controller 10 determines a drive direction and a drive amount of the focus lens on the basis of the information for contrast AF and drives the focus lens of the lens 1 by the focus control mechanism 8.

Note that only one of the image plane phase-difference AF and the contrast AF may be performed or both may be used in a complementary manner. For example, in a case where both are used, there is a method of use in which the image plane phase-difference AF is performed first to move the focus lens to a rough focus position, and then, the contrast AF is performed to move the focus lens to a precise focus position.

The second image processing circuit 14 includes a synthesis circuit 41, a dark image correction circuit 42, an image fundamental processing circuit 43, a RAW compressed/expanded file creation circuit 46, and a record/read circuit 47.

Note that while an example will be described here where the second image processing circuit 14 includes the synthesis circuit 41, the dark image correction circuit 42, the image fundamental processing circuit 43, the RAW compressed/expanded file creation circuit 46 and the record/read circuit 47, the second image processing circuit 14 does not have to include all of the synthesis circuit 41, the dark image correction circuit 42, the image fundamental processing circuit 43, the RAW compressed/expanded file creation circuit 46 and the record/read circuit 47 if components necessary as a system change. Further, the second image processing circuit 14 does not have to have all of respective processing functions within the respective circuits.

The synthesis circuit 41 synthesizes a plurality of images to generate one synthesized image. As an example, the synthesis circuit 41 generates a multiple exposure image using a plurality of images.

The dark image correction circuit 42 performs dark correction by subtracting RAW image data obtained in a state where the image sensor 2 is shaded from RAW image data obtained by exposure. Further, the dark image correction circuit 42 may perform dark correction on RAW image data subjected to resize processing by the resize circuit 32 in a similar manner.

The image fundamental processing circuit 43 performs fundamental image processing such as demosaic processing, noise cancellation processing, gamma conversion processing, white balance processing, color matrix processing and edge processing on the RAW image data subjected to dark correction by the dark image correction circuit 42 or the RAW image data generated by the synthesis circuit 41 as appropriate. Here, the reason why the processing is referred to as fundamental image processing is because the image fundamental processing circuit 43 performs processing in common to generate a still image, a movie and a live view image.

The image fundamental processing circuit 43 further includes a still image processing circuit 44 and a moving image processing circuit 45.

The still image processing circuit 44 performs processing specific to a still image on the still image subjected to fundamental image processing and then, for example, performs JPEG compression (where a compression scheme is not limited to JPEG) to generate a JPEG file.

The moving image processing circuit 45 performs processing specific to a moving image on a moving image frame subjected to fundamental image processing and then, for example, performs MPEG compression (where a compression scheme is not limited to MPEG) to generate a MPEG file. Here, appropriate techniques may be employed as a video codec technique and a voice codec technique to be used by the moving image processing circuit 45.

The RAW compressed/expanded file creation circuit 46 serves as a RAW compression circuit that compresses the RAW image data, a file creation circuit that creates a file of the RAW image data to generate a RAW image file, and a RAW expansion circuit that expands the compressed RAW image data.

The record/read circuit 47 serves as a file record circuit that records the RAW image file generated by the RAW compressed/expanded file creation circuit 46, the JPEG file generated by the still image processing circuit 44, and the MPEG file generated by the moving image processing circuit 45 in the memory 5 for recording, and a file read circuit that reads the RAW image file, the JPEG file and the MPEG file recorded in the memory 5 for recording.

FIG. 4 is a view illustrating part of image data read from the image sensor 2 using the normal read scheme in the second read mode and sorted by the sorting circuit 21.

In the example illustrated in FIG. 4, the first to the second rows, and (p+2)-th to (p+3)-th rows are read in 1PD (first read mode), and p-th to (p+1)-th rows and (last−1)-th to the last rows are read in 2PD (second read mode). Here, in a case of 2PD in which operation is performed using the normal read scheme, one L divided pixel row and one R divided pixel row are read concerning one pixel row. Thus, image pickup signals relating to the two divided pixel signals become a divided pixel signal L and a divided pixel signal R.

The divided pixel signal L and the divided pixel signal R read from the 2PD region are added by the PD mix circuit 22 in the subsequent stage of the sorting circuit 21 to generate a pixel signal. Further, FIG. 4 also illustrates an example where operation is performed using the normal read scheme in a case of 4PD. The example indicates a case where the p-th to (p+1)-th rows and the (last−1)-th to the last rows are read with signals (LU+LD) and (RU+RD) generated by divided pixel signals of 4PD.

Further, FIG. 5 is a view illustrating part of image data read from the image sensor 2 using the addition read scheme in the second read mode and sorted by the sorting circuit 21.

In the example illustrated in FIG. 5, the first to the second rows and the (p+2)-th to (p+3)-th rows are read in 1PD (the first read mode), and the p-th to (p+1)-th rows and the (last−1)-th to the last rows are read in 2PD (second read mode). Here, in a case of 2PD in which operation is performed using the addition read scheme, one L divided pixel row and one (L+R) pixel row are read concerning one pixel row. Thus, image pickup signals relating to the two divided pixel signals become a divided pixel signal L and a pixel signal (L+R). Note that as described above, a divided pixel signal R may be outputted in place of the divided pixel signal L.

In a case of the addition read scheme, the divided pixel signal L and the divided pixel signal R are added within the image sensor 2, and thus, the PD mix circuit 22 of the image processing circuit 3 does not have to perform addition and only needs to extract a pixel signal (L+R) within the divided pixel signal L and the pixel signal (L+R) read from the 2PD region. Further, FIG. 5 illustrates an example of a case where operation is performed using the addition read scheme in a case of 4PD. The example indicates a case where the p-th to (p+1)-th rows and the (last−1)-th to the last rows are read with a signal (LU+LD) and a pixel signal (LU+LD+RU+RD) generated from the divided pixel signals of 4PD.

Figure 6:
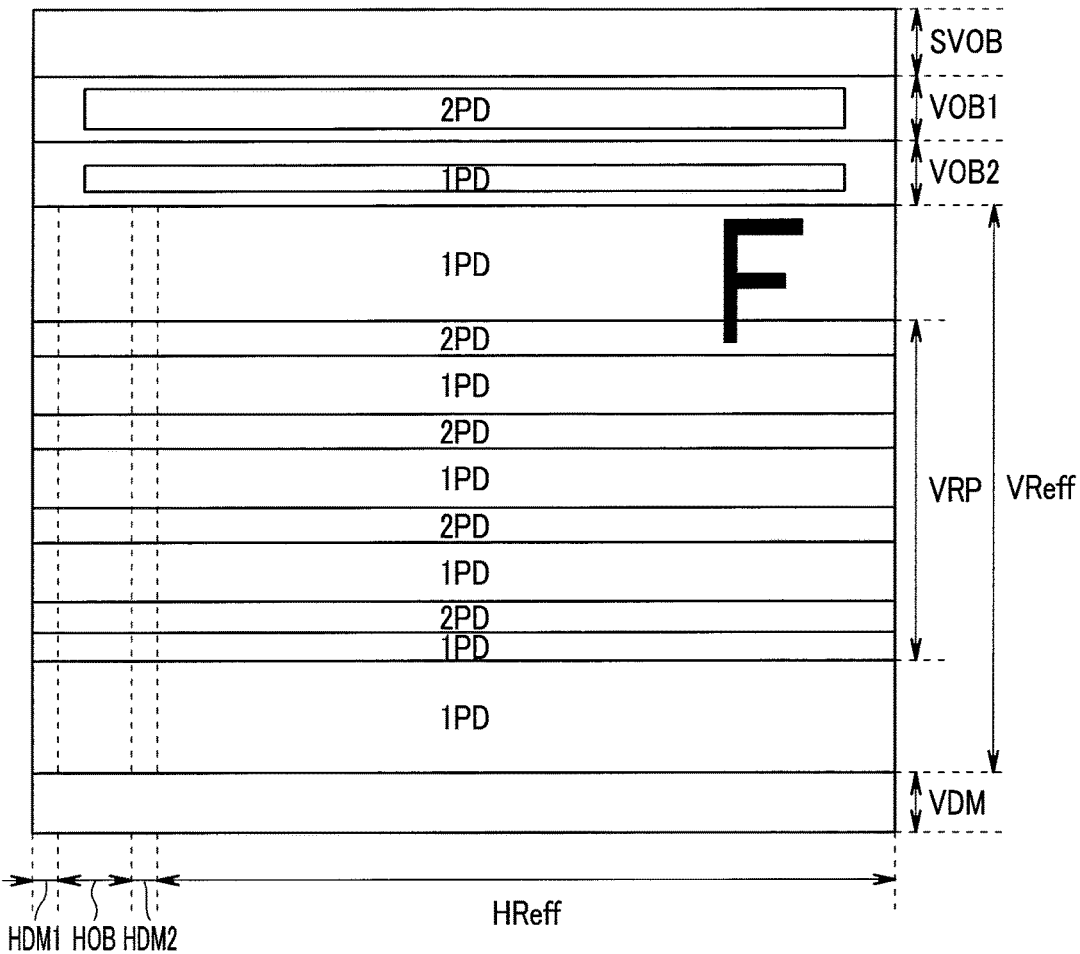
FIG. 6 is a view illustrating a configuration of image data read from the image sensor in the above-described embodiment and sorted by the sorting circuit.

FIG. 6 is a view illustrating a configuration of image data read from the image sensor 2 and sorted by the sorting circuit 21. In FIG. 6, a horizontal direction is a row direction, and a vertical direction is a column direction. Arrangement of the image data indicated in FIG. 6 is one example of arrangement in which reading is performed for physical arrangement of normal pixels, OB pixels, and the like, on the image sensor 2 in the first read mode or the second read mode in the high-speed video phase-difference read mode.

The image data includes a sensor clamp region SVOB, a vertical OB region (a first vertical OB region VOB1 and a second vertical OB region VOB2) in which shaded OB pixels are disposed, an effective region VReff in which normal pixels that are not shaded are disposed, and a dummy region VDM sequentially from top to bottom.

Further, the image data includes a first horizontal dummy region HDM1, a horizontal OB region HOB in which shaded OB pixels are disposed, a second horizontal dummy region HDM2, and an effective region/execution region HReff in which normal pixels that are not shaded are disposed sequentially from left to right.

Further, in a case where the image sensor 2 operates in the high-speed video phase-difference read mode, 2PD reading is performed in part of the vertical OB region, for example, the first vertical OB region VOB1, and 1PD reading is performed in the other part of the vertical OB region, for example, the second vertical OB region VOB2. Here, desired rows can be set as a start row and an end row of the first vertical OB region VOB1 and a start row and an end row of the second vertical OB region VOB2 in the vertical OB region.

Further, not all of the first vertical OB region VOB1 and not all of the second vertical OB region VOB2 do not have to be used for detection of the OB level. For example, the OB level may be detected using data within a quadrangular region set within the first vertical OB region VOB1 and data within a quadrangular region set within the second vertical OB region VOB2.

Further, in a case where the image sensor 2 operates in the high-speed video phase-difference read mode, a phase-difference detection region VRP is set within the effective region VReff. Here, desired rows can be set as a start row and an end row of the phase-difference detection region VRP in the effective region VReff. Further, a plurality of phase-difference detection regions VRP may be set in the effective region VReff. Thus, by setting an appropriate phase-difference detection region VRP for an AF area set in accordance with an object, a period for reading a frame image can be shortened.

Further, reading is performed in 1PD in a region other than the phase-difference detection region VRP within the effective region VReff, and reading is performed in 1PD or 2PD for each pixel row within the phase-difference detection region VRP. Thus, in the phase-difference detection region VRP, divided pixel rows for which reading is performed in 2PD and which are a successive multiple of two rows, and one or more successive pixel rows for which reading is performed in 1PD, alternately appear. While a case of 2PD has been described above, the same will apply to cases of 4PD, and the like.

Figure 7:
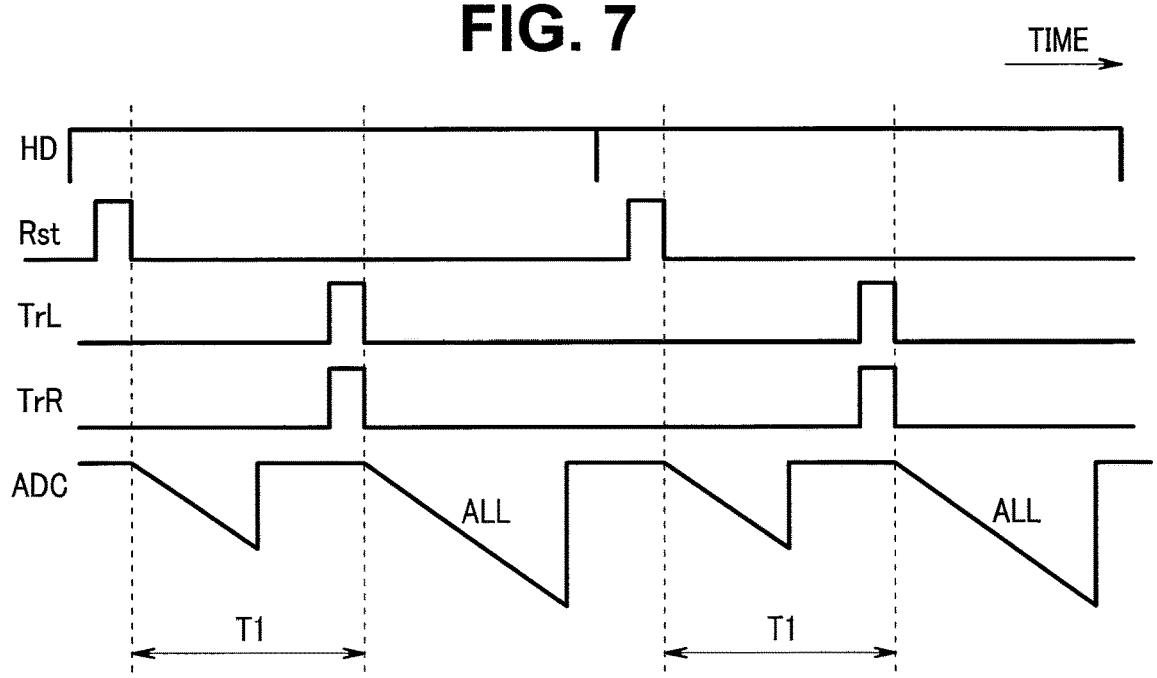
FIG. 7 is a timing chart indicating action of a read circuit in a 1PD region in the image sensor in the above-described embodiment.

FIG. 7 is a timing chart indicating action of the read circuit in the 1PD region in the image sensor 2.

By turning on the transistor TrRES (high level in a reset signal Rst) at a predetermined timing in accordance with a vertical synchronization signal HD, the floating diffusion FD is reset. By turning on the transistor TrSEL after reset, a reset voltage value is read as a reset signal. The read reset signal is subjected to analog-to-digital conversion (ADC) by the column ADC.

Subsequently, by turning on the transistor TrL and the transistor TrR (high level in a signal to be applied to TrL and TrR), charges of the photoelectric conversion element PDL and the photoelectric conversion element PDR are transferred to the floating diffusion FD. By turning on the transistor TrSEL after transferring, voltage values of charges accumulated in the floating diffusion FD are read as a pixel signal (which will be described as ALL because the pixel signal is a pixel signal of the charges generated in all the photoelectric conversion elements PDL and PDR provided within one pixel). The read pixel signal ALL is subjected to analog-to-digital conversion (ADC) by the column ADC.

Also thereafter, a reset signal and a pixel signal are read in a similar manner in synchronization with the vertical synchronization signal HD. By subtracting the reset signal from the pixel signal, correlated double sampling (CDS) is performed, and thereby reset noise, and the like, are reduced. A difference between acquisition time of the reset signal and acquisition time of the pixel signal in this event becomes a CDS period T1 indicated in FIG. 7.

FIG. 8 is a timing chart indicating action of the read circuit in the 2PD region in the image sensor 2 using the normal read scheme.

In a similar manner to the above, first, the floating diffusion FD is reset to read a reset signal, and the reset signal is subjected to ADC.

Subsequently, by turning on the transistor TrL, a charge of the photoelectric conversion element PDL is transferred to the floating diffusion FD. By turning on the transistor TrSEL after transferring, a voltage value of the charge accumulated in the floating diffusion FD is read as a divided pixel signal L. The read divided pixel signal L is subjected to analog-to-digital conversion (ADC) by the column ADC.

By subtracting the reset signal from the divided pixel signal L, correlated double sampling (CDS) is performed, and thereby reset noise, and the like, are reduced. A difference between acquisition time of the reset signal and acquisition time of the divided pixel signal L in this event becomes a CDS period T1 indicated in FIG. 8.

Thereafter, at a predetermined timing in accordance with the vertical synchronization signal HD, the floating diffusion FD is reset to read a reset signal, and the reset signal is subjected to ADC.

Subsequently, by turning on the transistor TrR, the charge of the photoelectric conversion element PDR is transferred to the floating diffusion FD. By turning on the transistor TrSEL after transferring, a voltage value of the charge accumulated in the floating diffusion FD is read as the divided pixel signal R. The read divided pixel signal R is subjected to analog-to-digital conversion (ADC) by the column ADC.

By subtracting the reset signal from the divided pixel signal R, correlated double sampling (CDS) is performed, and thereby reset noise, and the like, are reduced. A difference between acquisition time of the reset signal and acquisition time of the divided pixel signal R in this event becomes the CDS period T1 indicated in FIG. 8 in a similar manner to a case of the divided pixel signal L.

FIG. 9 is a timing chart indicating action of the read circuit in the 2PD region in the image sensor 2 using the addition read scheme.

In a similar manner to the above, first, the floating diffusion FD is reset to read a reset signal, and the reset signal is subjected to ADC.

Subsequently, in a similar manner to the above, the charge of the photoelectric conversion element PDL is transferred to the floating diffusion FD, and the divided pixel signal L is read and subjected to ADC.

By subtracting the reset signal from the divided pixel signal L, correlated double sampling (CDS) is performed, and thereby reset noise, and the like, are reduced. A difference between acquisition time of the reset signal and the divided pixel signal L in this event becomes the CDS period T1 indicated in FIG. 9.

Subsequently, by turning on the transistor TrR without resetting the floating diffusion FD, the charge of the photoelectric conversion element PDR is further transferred to the floating diffusion FD. As a result, the charge of the photoelectric conversion element PDL and the charge of the photoelectric conversion element PDR are accumulated in the floating diffusion FD.

By turning on the transistor TrSEL after transferring, a voltage value of the charges accumulated in the floating diffusion FD is read as a pixel signal (L+R). The read pixel signal (L+R) is subjected to analog-to-digital conversion (ADC) by the column ADC.

By subtracting the reset signal from the pixel signal (L+R), correlated double sampling (CDS) is performed, and thereby reset noise, and the like, are reduced. A difference between acquisition time of the reset signal and acquisition time of the pixel signal (L+R) in this event becomes a CDS period T2 indicated in FIG. 9. Here, T2>T1.

Note that while the pixel signal read from the 1PD region will be described as ALL, the pixel signal read from the 2PD region will be described as (L+R), because the CDS periods are different, and thus, the pixel signal ALL is not always the same as the pixel signal (L+R) as will be described later. While a case of 2PD has been described above, the same will apply to cases of 4PD, and the like.

Figure 10:
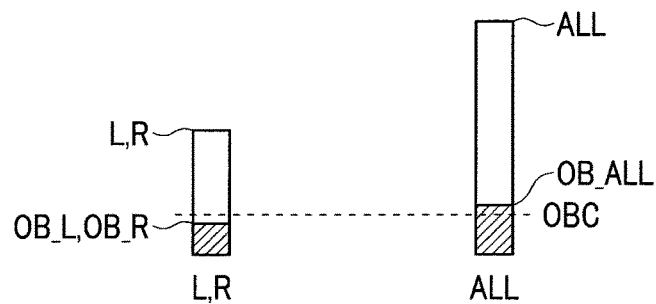
FIG. 10 is a view illustrating an example of OB levels of a divided pixel signal read from the 2PD region and a pixel signal read from the 1PD region when the image sensor operates using the normal read scheme and the image sensor includes one OB clamping circuit in the above-described embodiment.

FIG. 10 is a view illustrating an example of OB levels of the divided pixel signals L and R read from the 2PD region and the pixel signal ALL read from the 1PD region when the image sensor 2 operates using the normal read scheme and the image sensor 2 includes one OB clamping circuit 2a.

In a case where there is no bias in light beams that pass through the micro lens ML, the divided pixel signal L generated at the photoelectric conversion element PDL and the divided pixel signal R generated at the photoelectric conversion element PDR normally become approximately half the total pixel signal ALL generated at the photoelectric conversion element PDL and the photoelectric conversion element PDR.

Further, the image sensor 2 typically sets an OB level of the image pickup signal at a predetermined target level (OB clamping level) (fixed value) and outputs a value obtained by adding a pixel signal in proportion to an amount of incident light to the predetermined target level.

The image sensor 2 performs processing on the OB level (OB clamping processing) so that a signal level of a shaded pixel detected in a sensor clamp region SVOB that is a shaded region becomes a fixed value (in a case of 12-bit ADC, often set at, for example, 256 LSB) as a digital value.

Here, concerning the OB level due to a dark current generated in the sensor clamp region SVOB, a dark current generated at the photoelectric conversion element PDL and a dark current generated at the photoelectric conversion element PDR become approximately half a total dark current generated at the photoelectric conversion element PDL and the photoelectric conversion element PDR (concerning the OB level, the level of the divided pixel signals becomes approximately half the level of the pixel signal in a similar manner to a case of a signal generated through photoelectric conversion).

In a case where the image sensor 2 includes one OB clamping circuit 2a and detects an OB level without distinguishing between the 1PD region and the 2PD region in which operation is performed using the normal read scheme (in other words, L and R are separately read) in the sensor clamp region SVOB, while the OB level can change in accordance with time constant settings of the OB clamping processing or patterns of the 1PD region and the 2PD region, for example, an average value of dark currents in the 1PD region and the 2PD region is detected as the OB level, and OB clamping is performed at the detected OB level.

Thus, as indicated in FIG. 10, as a result of the average value of the dark currents in the 1PD region and the 2PD region being processed to be the OB clamping level OBC, an OB level OB_L of the photoelectric conversion element PDL and an OB level OB_R of the photoelectric conversion element PDR become lower than the OB clamping level OBC that is a fixed value after the OB clamping processing, and an OB level OB_ALL due to a total dark current generated at the photoelectric conversion element PDL and the photoelectric conversion element PDR becomes higher than the OB clamping level OBC that is a fixed value.

A difference between the OB level OB_L (or the OB level OB_R) and the OB level OB_ALL corresponds to a difference between an amount of the dark current generated at the photoelectric conversion element PDL (or the photoelectric conversion element PDR) and an amount of the dark current generated at both the photoelectric conversion element PDL and the photoelectric conversion element PDR.

In this manner, the signals outputted from the effective region VReff of the image sensor 2 have a signal level L obtained by adding a level (L−OB_L) of an amount of photoelectric conversion by the photoelectric conversion element PDL to the OB level OB_L, a signal level R obtained by adding a level (R−OB_R) of an amount of photoelectric conversion by the photoelectric conversion element PDR to the OB level OB_R, and a signal level ALL obtained by adding a level (ALL−OB_ALL) of an amount of photoelectric conversion by the photoelectric conversion element PDL and the photoelectric conversion element PDR to the OB level OB_ALL.

As a result, an OB level (OB_L+OB_R) included in the pixel signal generated by adding the divided pixel signal L generated at the photoelectric conversion element PDL and the divided pixel signal R generated at the photoelectric conversion element PDR typically does not match the OB level OB_ALL, and thus, a gap occurs in the pixel signal between the 1PD region and the 2PD region. Such a gap in the signal value becomes prominent in a region in which the amount of photoelectric conversion is small (in other words, a dark region).

Thus, processing (1) to (3) in which the PD mix circuit 22 adds the divided pixel signals R and L read from the 2PD region using the normal read scheme while reducing a difference in the OB level from the 1PD region will be described.

(1) Processing of Calculating OB Level from Signal in Vertical OB Region

The PD mix circuit 22 calculates the OB level OB_L on the basis of the signal read from the photoelectric conversion element PDL in the quadrangular region (2PD region) set within the first vertical OB region VOB1 and calculates the OB level OB_R on the basis of the signal read from the photoelectric conversion element PDR in the quadrangular region set within the first vertical OB region VOB1. Further, the PD mix circuit 22 calculates the OB level OB_ALL on the basis of the signals read from the photoelectric conversion element PDL and the photoelectric conversion element PDR in the quadrangular region (1PD region) set within the second vertical OB region VOB2.

(2) Processing of Adding Right and Left Divided Pixel Signals in Vertical OB Region The PD mix circuit 22 also performs operation similar to the operation in the effective region VReff, in the vertical OB region and adds left and right divided pixel signals. Thus, the following addition value SumOB is calculated.

$$Sum_{OB} = OB\_L + OB\_R$$

The processing does not necessarily have to be performed in this manner. As is clear from the subsequent processing, the image becomes an image subjected to clamping at a level of OB_ALL through processing performed by the PD mix circuit 22 on the effective region VReff. Further, the OB level of the image is detected in the second vertical OB region VOB2 in which OB_ALL can be detected.

(3) Processing of Adding Right and Left Divided Pixel Signals in Effective Region VReff The PD mix circuit 22 performs the following calculation on the 2PD region in the phase-difference detection region VRP set in the effective region VReff to obtain a calculation result Sum.

$$Sum = (L-OB\_L) + (R-OB\_R) + OB\_ALL$$

In the processing, n (in this example, two, the same will apply hereafter) divided pixel signals L and R read from the normal pixels in the second read mode are added to generate an added normal pixel signal (L+R), n divided pixel signals OB_L and OB_R read from the OB pixels in the second read mode are added to generate an added OB pixel signal (OB_L+OB_R), the added OB pixel signal (OB_L+OB_R) is subtracted from the added normal pixel signal (L+R), a temporary OB subtracted pixel signal {(L−OB_L)+(R−OB_R)} is generated, and the OB pixel signal OB_ALL read from the OB pixels in the first read mode is added to the temporary OB subtracted pixel signal {(L−OB_L)+(R−OB_R)} to generate a calculation result Sum as pixel data. Thereafter, the PD mix circuit 22 arranges the generated pixel data to generate a second pixel data array.

Note that the processing described here can be reworded as processing of performing addition processing (L+R) for obtaining a pixel signal and processing of removing the OB level OB_L included in the divided pixel signal L (L−OB_L), removing the OB level OB_R included in the divided pixel signal R (R−OB_R) and adding the OB level OB_ALL included in the pixel signal in the 1PD region.

By performing the pixel signal generation processing (1) to (3) described above, the OB level of the pixel signal obtained by reading the pixel signals from the 2PD region and adding the pixel signals can be accurately made the same as the OB level of the pixel signal read from the 1PD region. Further, through processing similar to the processing in the above description, it is possible to achieve processing of making the OB level of the pixel signal obtained by reading the pixel signals from the 1PD region and adding the pixel signals the same as the OB level of the pixel signal read from the 2PD region. While a case of 2PD has been described above, the same will apply to cases of 4PD, and the like.

In this manner, the PD mix circuit 22 performs correction processing of the OB level on the normal pixel signal generated or extracted from n signals read from the normal pixel in the second read mode using the OB pixel signal generated or extracted from n signals read from the OB pixel in the second read mode and the OB pixel signal read from the OB pixel in the first read mode.

Note that a value of the OB level is typically slightly different for each color (Rr, Gr, Gb and Bb) of Bayer. Colors of Bayer are generated by color filters, and thus, there is no difference in an actual pixel circuit per se even if the color is different. However, if the color is different, a location where the pixel circuit is disposed becomes different, which leads to a difference in a wiring route (such as a wiring location and a wiring length) to the pixel circuit, and thus, a difference in the OB level occurs due to the differences.

To address the differences, the PD mix circuit 22 performs correction processing of making the OB levels the same as described above separately for each filter color of the pixel while distinguishing among the filter colors (except in a case where a difference in the OB level by the filter color may be ignored).

Figure 11:
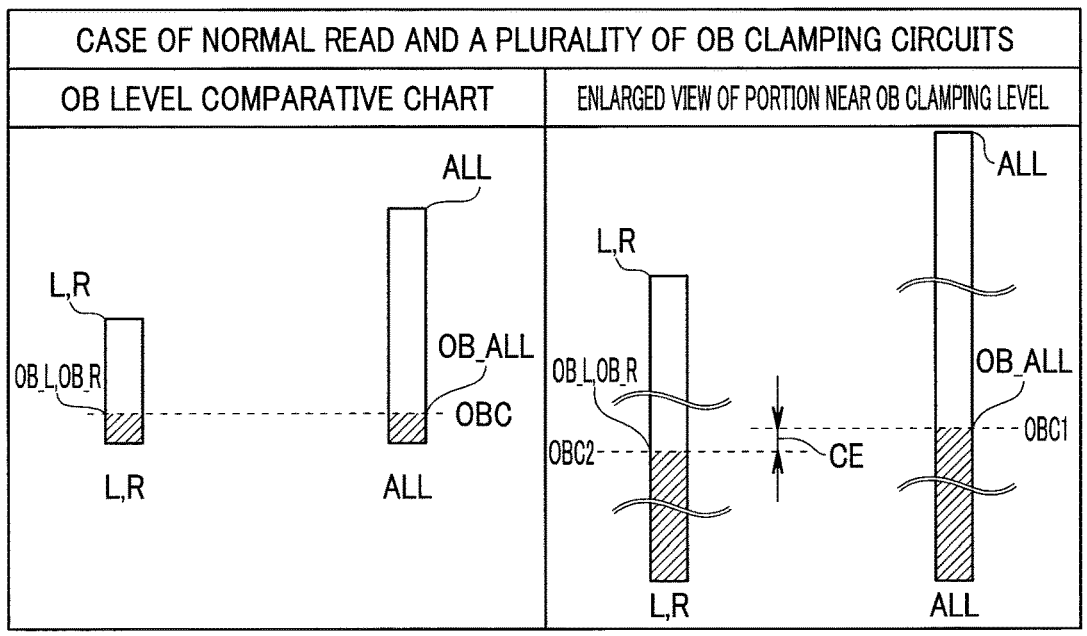
FIG. 11 is a view illustrating an example of OB levels of a divided pixel signal read from the 2PD region and a pixel signal read from the 1PD region when the image sensor operates using the normal read scheme and the image sensor includes two OB clamping circuits in the above-described embodiment.

FIG. 11 is a view illustrating an example of the OB levels of the divided pixel signals L and R read from the 2PD region and the pixel signal ALL read from the 1PD region when the image sensor 2 operates using the normal read scheme, and the image sensor 2 includes two OB clamping circuits 2a.

Here, the first OB clamping circuit 2a out of the two OB clamping circuits 2a is provided for detecting the OB level OB_ALL in the 1PD region and performing OB clamping on the pixel signal read in the first read mode, and the second OB clamping circuit 2a is provided for detecting the OB level OB_L of the divided pixel signal L and the OB level OB_R of the divided pixel signal R and performing OB clamping on n divided pixel signals read in the second read mode.

In a case of such a configuration, if the two OB clamping circuits 2a perform completely the same operation, the OB clamping level OBC2 of the divided pixel signals L and R in the 2PD region should become the same level as the OB clamping level OBC1 of the pixel signal in the 1PD region. Further as indicated in an OB level comparative chart in a left part of FIG. 11, it is expected that a difference between the OB levels OB_L and OB_R in the 2PD region and the OB level OB_ALL in the 1PD region is absorbed.

However, even if the two OB clamping circuits 2a have the same configuration, the two OB clamping circuits 2a do not perform completely the same operation due to variation in circuit components, a difference in locations where the circuits are actually disposed and a difference in routes of wirings relating to the circuits (such as wiring locations and wiring lengths). As indicated in an enlarged view in a right part of FIG. 11, there is a case where a slight difference CE may occur between the OB clamping level OBC1 and the OB clamping level OBC2 due to such differences.

For example, an amount of photoelectric conversion of an image with a small amount of photoelectric conversion of the image sensor 2, which is acquired in a photographing environment with a relatively low illumination level is amplified, for example, ten-fold to several hundred-fold by increasing gain. In this case, the slight difference CE of the OB clamping level is also amplified and becomes a factor of degrading image quality.

Thus, the PD mix circuit 22 performs processing of reducing the difference CE in the OB clamping level between the two OB clamping circuits 2a when the divided pixel signals R and L are added to generate a pixel signal. The image signal generation processing described here is the same as the processing (1) to (3) described above and becomes processing also effective for the difference CE in the OB clamping level by a plurality of OB clamping circuits 2a.

Further, the PD mix circuit 22 preferably performs correction processing of making the OB levels the same separately for each filter color of the pixel while distinguishing among the filter colors in a similar manner to described above.

Figure 12:
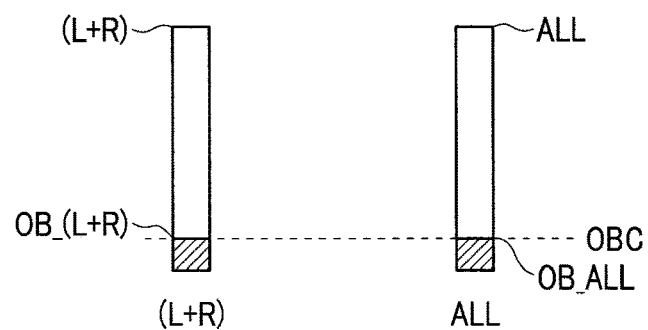
FIG. 12 is a view illustrating an example of OB levels when a pixel signal (L+R) read from the 2PD region and a pixel signal ALL read from the 1PD region of the image sensor that operates using the addition read scheme are subjected to OB clamping at one OB clamping circuit in the above-described embodiment.

Next, FIG. 12 is a view indicating an example of OB levels when the pixel signal (L+R) read from the 2PD region and the pixel signal ALL read from the 1PD region of the image sensor 2 that operates using the addition read scheme are subjected to OB clamping at one OB clamping circuit 2a. Here, pixel signals other than the pixel signal (L+R) read from the 2PD region are still subjected to OB clamping at the second OB clamping circuit 2a.

If the pixel signal (L+R) read from the 2PD region using the addition read scheme in the second read mode and the pixel signal ALL read from the 1PD region in the first read mode are subjected to clamping in common at one OB clamping circuit 2a, the OB levels basically become the same.

The pixel signal generation processing (1) to (3) in this case becomes as follows.
(1) Processing of Calculating OB Level from Signal in Vertical OB Region The processing by the PD mix circuit 22 becomes unnecessary.
(2) Processing of Adding Right and Left Divided Pixel Signals in Vertical OB Region The addition processing is performed within the image sensor 2, and thus, the PD mix circuit 22 does not have to perform addition processing and is only required to select the OB level OB_(L+R) obtained by adding the right and left divided pixel signals outputted from the 2PD region in the vertical OB region.

(3) Processing of Adding Right and Left Divided Pixel Signals in Effective Region VReff In a similar manner, the addition processing is performed within the image sensor 2, and thus, the PD mix circuit 22 does not have to perform addition processing and is only required to select the pixel signal (L+R) obtained by adding the right and left divided pixel signals outputted from the 2PD region in the phase-difference detection region VRP set in the effective region VReff.

However, as can be clear from comparison between the timing chart of 1PD reading indicated in FIG. 7 and the timing chart of 2PD reading in the addition read scheme indicated in FIG. 9, a time interval (CDS period T1) from when the floating diffusion FD is reset until when the pixel signal ALL is read is different from a time interval (CDS period T2) from when the floating diffusion FD is reset until when the pixel signal (L+R) is read in a time length.

Due to a difference between the CDS period T1 and the CDS period T2, there is a case where a slight difference may occur between the OB level OB_(L+R) of the pixel signal (L+R) read from the 2PD region and the OB level OB_ALL of the pixel signal ALL read from the 1PD region. Processing in a case where such a difference occurs will be described with reference to FIG. 13.

Figure 13:
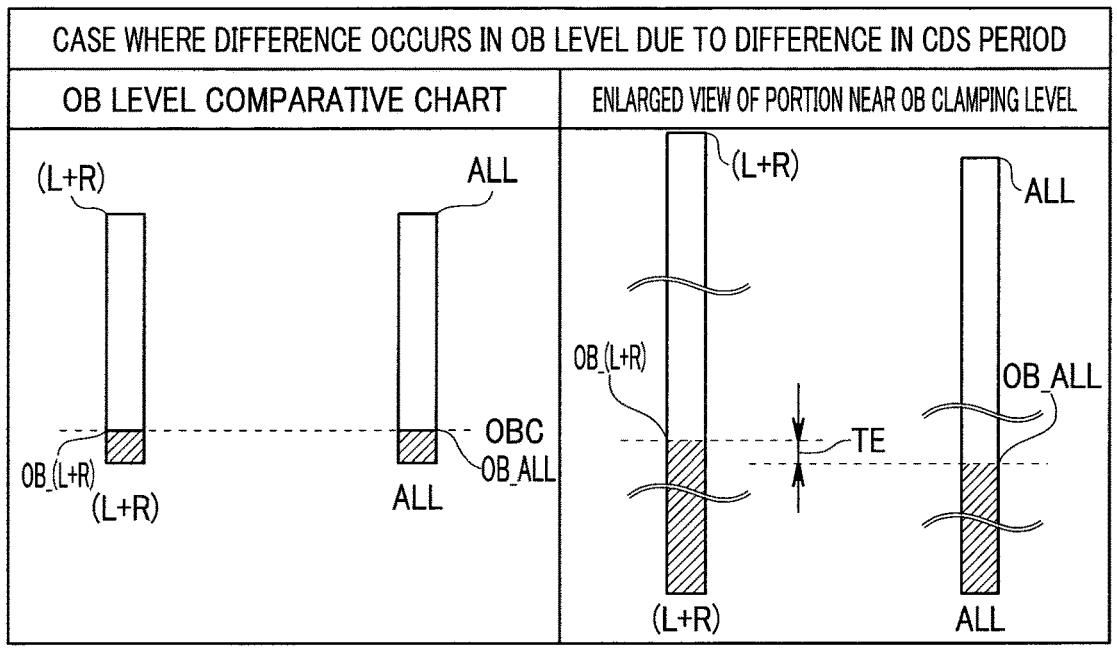
FIG. 13 is a view illustrating an example where a difference in an OB level due to a difference in a CDS period occurs between the pixel signal (L+R) read from the 2PD region and the pixel signal ALL read from the 1PD region of the image sensor that operates using the addition read scheme in the above-described embodiment.

FIG. 13 is a view indicating an example where a difference in the OB level occurs due to a difference in the CDS period between the pixel signal (L+R) read from the 2PD region and the pixel signal ALL read from the 1PD region, of the image sensor 2 that operates using the addition read scheme.

If the CDS period T1 is different from the CDS period T2, an amount of the dark current generated in the floating diffusion FD, or the like, becomes different, and thus, as indicated in the enlarged view in FIG. 13, the OB level OB_(L+R) of the pixel signal (L+R) does not become exactly the same as the OB level OB_ALL of the pixel signal ALL, and the OB level OB_(L+R) is different from the OB level OB_ALL by a slight difference TE.

The pixel signal generation processing (1) to (3) in such a case will be described.
(1) Processing of Calculating OB Level from Signal in Vertical OB Region The PD mix circuit 22 calculates the OB level OB_L on the basis of the signal read from the photoelectric conversion element PDL in the quadrangular region (2PD region) set within the first vertical OB region VOB1 and calculates the OB level OB_(L+R) on the basis of the signals read from the photoelectric conversion element PDL and the photoelectric conversion element PDR in the quadrangular region set within the first vertical OB region VOB1. Further, the PD mix circuit 22 calculates the OB level OB_ALL on the basis of the signals read from the photoelectric conversion element PDL and the photoelectric conversion element PDR in the quadrangular region (1PD region) set within the second vertical OB region VOB2.

In other words, OB_(L+R) from the 2PD region is distinguished from OB_ALL from the 1PD region.
(2) Processing of Adding Right and Left Divided Pixel Signals in Vertical OB Region The addition processing is performed in the image sensor 2, and thus, the PD mix circuit 22 does not have to perform the addition processing and is only required to select the OB level OB_(L+R) obtained by adding the right and left divided pixel signals outputted from the 2PD region of the vertical OB region.

(3) Processing of Adding Right and Left Divided Pixel Signals in Effective Region VReff The PD mix circuit 22 performs the following calculation on the 2PD region in the phase-difference detection region VRP set in the effective region VReff to obtain a calculation result Sum.

$$\text{Sum} = \{(L+R) - OB\_(L+R)\} + OB\_ALL$$

The processing is processing of extracting the normal pixel signal (L+R) read from the normal pixel in the second read mode, extracting the OB pixel signal OB_(L+R) read from the OB pixel in the second read mode, subtracting the OB pixel signal OB_(L+R) from the normal pixel signal (L+R) to generate a temporary OB subtracted pixel signal {(L+R)−OB_(L+R)}, and adding the OB pixel signal OB_ALL read from the OB pixel in the first read mode to the temporary OB subtracted pixel signal {(L+R)−OB_(L+R)} to generate a calculation result Sum as pixel data. Thereafter, the PD mix circuit 22 arranges the generated pixel data to generate a second pixel data array. Further, through processing similar to the processing described above, processing of accurately making the pixel signal the same as the OB pixel signal OB_(L+R) read from the normal pixel in the second read mode can be achieved.

In this manner, processing of subtracting the OB level of the 2PD region and adding the OB level in the 1PD region is effective for a difference in the OB level due to a difference in the CDS period.

Further, the PD mix circuit 22 preferably performs correction processing of making the OB level the same separately for each filter color of the pixel while distinguishing among the filter colors in a similar manner to described above.

Note that in a case where the image sensor 2 includes the first OB clamping circuit 2a and the second OB clamping circuit 2a, OB clamping of the pixel signal read in the first read mode and OB clamping of one pixel signal read in the second read mode may be performed by, for example, the first OB clamping circuit 2a. In this event, it is only necessary that the second OB clamping circuit 2a performs OB clamping of (n−1) signals read in the second read mode. While a case of 2PD has been described above, it is only necessary to perform similar processing in cases of 4PD, and the like.

Next, processing of the dark shading correction circuit 23 that supports PD mix processing will be described.

The PD mix circuit 22 performs the pixel signal generation processing as described above and outputs image data (RAW image data) including only the pixel signal (in other words, not including the divided pixel signal).

The dark shading correction circuit 23 that supports PD mix processing performs dark shading correction on the RAW image data inputted from the PD mix circuit 22.

The dark shading correction is processing for making fluctuation in a level for each pixel occurring in plane of the image sensor 2 during dark time (while incident light is blocked), uniform.

While methods of the dark shading correction include various methods in view of a circuit scale, processing efficiency (such as a processing period required for correction and a data size to be handled) and accuracy to be achieved, for example, processing in a two-image subtraction correction scheme in which a dark image is picked up and subtracted from a bright image for a level fluctuation pattern with relatively low regularity appearing in the whole image is employed.

In other words, in the two-image subtraction correction scheme, the dark image is subtracted from the bright image, and thus, in the corrected image, random noise increases compared to the bright image (or the dark image) before correction.

Thus, to reduce influence of the random noise in the dark image, a plurality of dark images are acquired, and the plurality of dark images are subjected to averaging processing to generate a shading image for correction and the generated shading image for correction is stored in a non-volatile storage portion of the memory 13 in advance. Then, the dark image stored in the memory 13 in advance is subtracted from the image inputted from the image sensor 2 to reduce influence of random noise.

Note that the shading image for correction does not have to be stored in the memory 13 in a non-volatile manner but may be dynamically generated and used. For example, the shading image for correction is generated by acquiring and averaging a plurality of dark images before a bright image is acquired and is stored in a non-volatile storage portion of the memory 13 in the image processing circuit 3 once. Then, the shading image for correction stored in the image processing circuit 3 once may be subtracted from the bright image to be acquired thereafter.

The PD mix circuit 22 performs PD mix processing in a preceding stage of the dark shading correction circuit 23 that supports PD mix processing.

Assuming fixed pattern noise due to a circuit, it can be regarded that there is substantially no difference in influence of dark shading between the divided pixel signals R and L read from the 2PD region using the normal read scheme and the pixel signal ALL read from the 1PD region. However, the pixel signal (L+R) obtained by performing addition processing on the divided pixel signals R and L at the PD mix circuit 22 becomes double (more generally, k times in a case where the pixel is divided into n, and in a case where reading is performed in k rows) by dark shading (more broadly, fixed pattern noise) being added (see a signal level of a high-speed video phase-difference read exposure image in FIG. 14). Here, k is a natural number (integer equal to or greater than 1) and is equal to or less than n.

Figure 14:
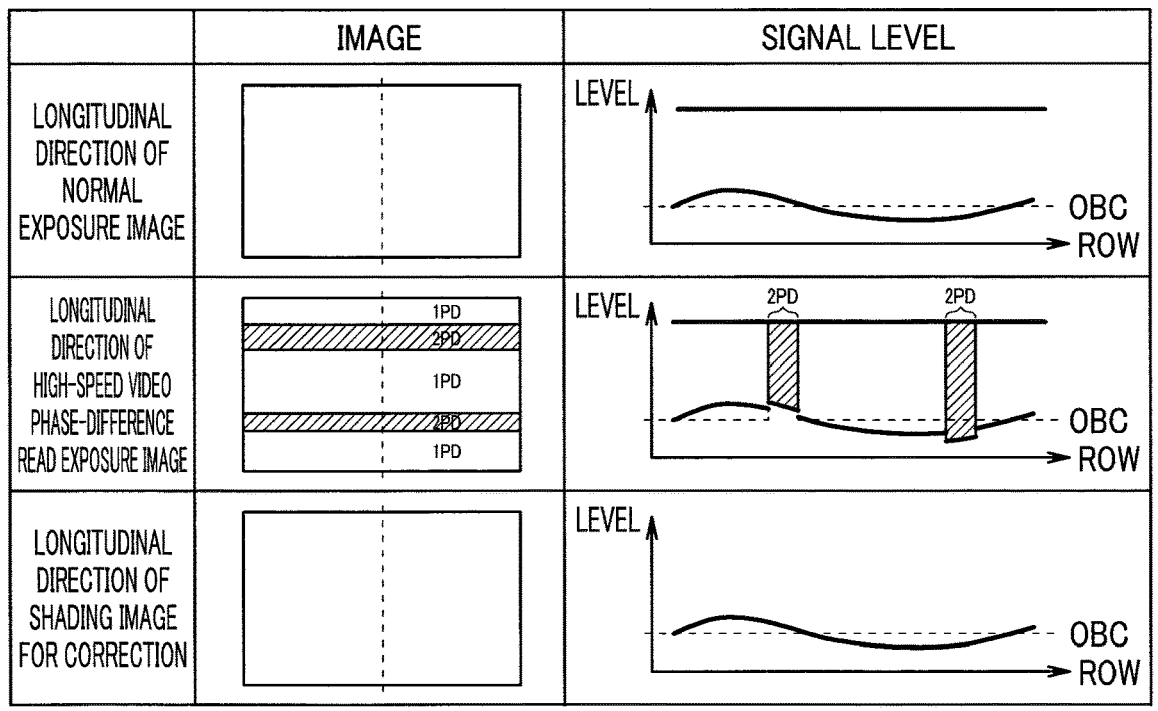
FIG. 14 is a view illustrating an example of dark shading in a normal exposure image, a high-speed video phase-difference read exposure image, and a shading image for correction in the above-described embodiment.

Here, FIG. 14 is a view illustrating an example of dark shading in a normal exposure image, a high-speed video phase-difference read exposure image (exposure image acquired in a high-speed video phase-difference read mode) and the shading image for correction.

Thus, an amount of dark shading is different between an image portion corresponding to the 1PD region and an image portion corresponding to the 2PD region in the image data to be received by the dark shading correction circuit 23 that supports PD mix processing.

Figure 15:
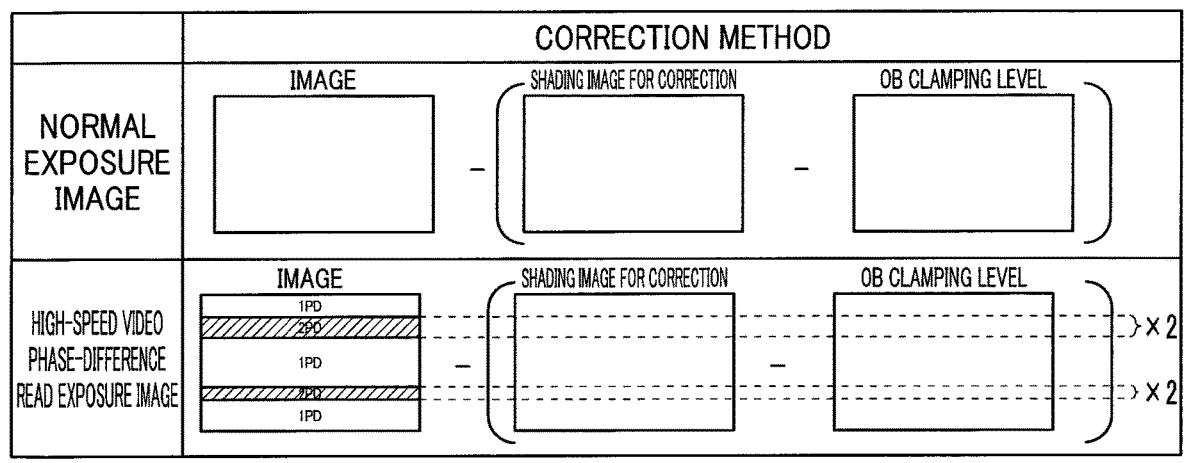
FIG. 15 is a view for explaining a dark shading correction method of the high-speed video phase-difference read exposure image in comparison with a dark shading correction method of the normal exposure image.

Thus, the dark shading correction circuit 23 that supports PD mix processing performs correction using a method as indicated in FIG. 15. FIG. 15 is a view for explaining a dark shading correction method of the high-speed video phase-difference read exposure image in comparison with a dark shading correction method of a normal exposure image.

First, in a case of the normal exposure image, as indicated in a field of a longitudinal direction of the normal exposure image in FIG. 14 and a field of a longitudinal direction of the shading image for correction in FIG. 14, dark shading which becomes a fluctuation amount with respect to the OB clamping level OBC that is a target level (fixed value) of OB clamping is included in the normal exposure image and the shading image for correction in a similar manner. Note that while not illustrated, also in a lateral direction of the image, dark shading that fluctuates with respect to the OB clamping level OBC is included.

Thus, as indicated in a field of the normal exposure image in FIG. 15, the OB clamping level OBC is subtracted from each pixel of the shading image for correction to generate dark shading data, and by subtracting the dark shading data in accordance with a pixel position from each piece of pixel data of the normal exposure image, a normal exposure image subjected to dark shading correction is obtained.

On the other hand, in a case of the high-speed video phase-difference read exposure image, the dark shading correction is performed through processing as indicated in a field of a high-speed video phase-difference read exposure image in FIG. 15.

In other words, the dark shading correction circuit 23 that supports PD mix processing divides the high-speed video phase-difference read exposure image into an image portion corresponding to the 1PD region (each piece of pixel data in the first pixel data array generated by the PD mix circuit 22) and an image portion corresponding to the 2PD region (each piece of pixel data in the second pixel data array generated by the PD mix circuit 22).

Further, the dark shading correction circuit 23 that supports PD mix processing reads the shading image for correction from the memory 13.

Further, the dark shading correction circuit 23 that supports PD mix processing performs dark shading correction by subtracting the OB clamping level OBC from respective pixels of the shading image for correction for the image portion corresponding to the 1PD region to generate dark shading data in a similar manner to the normal exposure image and subtracting the dark shading data in accordance with a pixel position from each piece of pixel data of the image portion corresponding to the 1PD region.

Further, the dark shading correction circuit 23 that supports PD mix processing performs dark shading correction by subtracting the OB clamping level OBC from respective pixels of the shading image for correction for the image portion corresponding to the 2PD region to generate dark shading data and subtracting data obtained by multiplying the dark shading data in accordance with a pixel position by k times (in a case of division into two, n=k, and double) from each piece of pixel data of the image portion corresponding to the 2PD region.

By performing such processing, dark shading correction of the high-speed video phase-difference read exposure image can be performed with high accuracy.

Note that while dark shading correction has been mainly described here, more generally, a correction method indicated in FIG. 15 can be applied to fixed pattern noise (FPN) (for example, fixed pattern noise of vertical stripe). In this event, the fixed pattern to be corrected is stored in advance in the memory 13, or the like, is read from the memory 13, or the like, upon correction, is subtracted as is for the image portion corresponding to the 1PD region and is subtracted after the fixed pattern is multiplied by k times for the image portion corresponding to the kPD region in a similar manner to described above.

According to such an embodiment, the image sensor 2 can read the image pickup signal relating to the n divided pixel signals for each pixel row in the first read mode or the second read mode, so that it is possible to obtain an image pickup apparatus which is capable of acquiring phase difference information while preventing decrease in an image pickup rate and which includes an image sensor in which a pixel is divided into a plurality of pixels.

Further, the PD mix circuit 22 generates the first pixel data array and the second pixel data array having the same arrangement order of pixel data, so that it is possible to use a circuit in related art (typical processing circuit described above) as a circuit to be disposed in a subsequent stage of the PD mix circuit 22 without substantially changing the circuit or depending on circumstances, use the circuit in related art as is, which can considerably reduce cost.

Further, the image pickup signals of the normal pixel and the OB pixel are read in the first read mode and the second read mode, and the PD mix circuit 22 performs processing of correcting the OB level on the normal pixel signal generated or extracted from n signals read from the normal pixel in the second read mode using the OB pixel signal generated or extracted from n signals read from the OB pixel in the second read mode and the OB pixel signal read from the OB pixel in the first read mode, so that the OB level can be corrected with high accuracy.

In a case where reading in the second read mode is performed using the normal read scheme, the added OB pixel signal obtained by adding the n divided pixel signals is subtracted from the added normal pixel signal obtained by adding the n divided pixel signals to generate a temporary OB subtracted pixel signal, and the OB pixel signal read from the OB pixel in the first read mode is added to the temporary OB subtracted pixel signal to generate pixel data, so that it is possible to make the OB level of the normal pixel signal generated from n signals read in the second read mode the same as the OB level of the normal pixel signal read from the normal pixel in the first read mode with high accuracy.

Further, also in a case where the image sensor 2 includes the plurality of OB clamping circuits 2a, the first OB clamping circuit 2a performs OB clamping on the pixel signal read in the first read mode, and the second OB clamping circuit 2a performs OB clamping on the n divided pixel signals read in the second read mode, the OB level can be corrected with high accuracy by applying a similar method.

On the other hand, in a case where reading is performed in the second read mode using the addition read scheme, by extracting the normal pixel signal read from the normal pixel in the second read mode, extracting the OB pixel signal read from the OB pixel in the second read mode, subtracting the OB pixel signal from the normal pixel signal to generate a temporary OB subtracted pixel signal and adding the OB pixel signal read from the OB pixel in the first read mode to the temporary OB subtracted pixel signal to generate pixel data, it is possible to make the OB level of the normal pixel signal extracted from n signals read in the second read mode the same as the OB level of the normal pixel signal read from the normal pixel in the first read mode with high accuracy.

In this event, in a case where the image sensor 2 includes a plurality of OB clamping circuits 2a, by the first OB clamping circuit 2a performing OB clamping of the pixel signal read in the first read mode and performing OB clamping of one pixel signal read in the second read mode, and the second OB clamping circuit 2a performing OB clamping of (n−1) signals read in the second read mode, it is possible to make the OB levels of the pixel signals constituting the RAW image the same while performing the OB clamping processing at high speed.

Further, by the PD mix circuit 22 performing processing of correcting the OB level for each filter color while distinguishing among the filter colors, even in a case where the OB level is different in accordance with the filter color, the OB level can be corrected with higher accuracy.

Further, appropriate OB level correction can be performed on the image pickup signal to be outputted from the image sensor 2 having a Bayer array as a basic array.

Further, by the dark shading correction circuit 23 that supports PD mix processing subtracting dark shading data in accordance with a pixel position from each piece of pixel data of the first pixel data array generated by the PD mix circuit 22 and subtracting data obtained by multiplying the dark shading data in accordance with the pixel position by n times from each piece of pixel data of the second pixel data array generated by the PD mix circuit 22, the dark shading correction in the high-speed video phase-difference read mode can be appropriately performed. Still further, by applying the correction method to fixed pattern noise, fixed pattern noise correction can be appropriately performed.

Further, a configuration in which the memory 13 stores the shading image for correction eliminates the need to acquire the shading image for correction every photographing, so that a photographing period can be shortened.

Note that the above-described respective circuits are not limited to electronic circuits constituted as hardware and may be respective circuit units in a processor including an integrated circuit (hardware) such as a FPGA (field programmable gate array) or may be constituted to perform functions of the respective circuits by causing a processor including hardware such as a CPU to execute software.

Further, while a case where the present invention is an image pickup apparatus has been mainly described above, the present invention is not limited to the image pickup apparatus and may be an image pickup method, a processing program for causing a computer to perform processing similar to processing of the image pickup apparatus, a computer-readable non-transitory recording medium that records the processing program, or the like.

Still further, the present invention is not limited to the embodiments described above without change and can be embodied by modifying components within a range not departing from the gist of the invention in an implementation phase. Further, various aspects of the invention can be formed by appropriate combination of a plurality of components disclosed in the above-described embodiments. For example, some components may be removed from all components disclosed in the embodiments. Still further, components across different embodiments may be combined as appropriate. In this manner, it is of course possible to make various modifications and applications within a range not departing from the gist of the invention.

What is claimed is:

1. An image pickup apparatus comprising:
    an image sensor in which a plurality of pixels are arranged in a row direction and in a direction intersecting with the row direction, assuming that n is an integer equal to or greater than 2, each of the plurality of pixels including one micro lens and n photoelectric conversion elements, the plurality of pixels including a normal pixel that is not shaded and an OB pixel that is a shaded optical black pixel, the image sensor being configured to output an image pickup signal relating to n divided pixel signals generated by performing photoelectric conversion on light from the micro lens by the n photoelectric conversion elements; and
    an image processing circuit configured to perform image processing on the image pickup signal outputted from the image sensor, wherein
    the image sensor can read the image pickup signal relating to the n divided pixel signals for each pixel row including a plurality of pixels arranged in the row direction in a first read mode or a second read mode,
    the first read mode is a mode in which the n divided pixel signals are added to generate one pixel signal, and one pixel row is read in one row,
    the second read mode is a mode in which n signals are generated from the n divided pixel signals, and one pixel row is read in n rows,
    the image pickup signal of the normal pixel is read in the first read mode and the second read mode, and the image pickup signal of the OB pixel is read in the first read mode and the second read mode,
    the image processing circuit includes a first circuit configured to generate a first pixel data array from a pixel signal in a pixel row read in the first read mode, generate or extract one pixel signal from the n signals in a pixel row read in the second read mode to generate a second pixel data array having an arrangement order of pixel data that is a same as an arrangement order of pixel data of the first pixel data array and generate image data in which pixel data is arranged in a predetermined order for each pixel row, and
    the first circuit performs OB level correction processing on a normal pixel signal generated or extracted from the n signals read from the normal pixel in the second read mode using an OB pixel signal generated or extracted from the n signals read from the OB pixel in the second read mode and an OB pixel signal read from the OB pixel in the first read mode.

2. The image pickup apparatus according to claim 1, wherein
    the image sensor reads the n divided pixel signals in n rows in the second read mode, and
    the first circuit adds the n divided pixel signals read from the normal pixel in the second read mode to generate an added normal pixel signal,
    adds the n divided pixel signals read from the OB pixel in the second read mode to generate an added OB pixel signal, and
    generates the pixel data by subtracting the added OB pixel signal from the added normal pixel signal and adding the OB pixel signal read from the OB pixel in the first read mode and arranges the generated pixel data to generate the second pixel data array.

3. The image pickup apparatus according to claim 2, wherein
    the image sensor includes a first OB clamping circuit and a second OB clamping circuit,
    the first OB clamping circuit performs OB clamping on the pixel signal read in the first read mode, and
    the second OB clamping circuit performs OB clamping on the n divided pixel signals read in the second read mode.

4. The image pickup apparatus according to claim 1, wherein
    the image sensor reads one pixel signal obtained by adding the n divided pixel signals and (n−1) signals from which the n divided pixel signals can be generated by being combined with the one pixel signal in n rows in the second read mode, and
    the first circuit extracts the normal pixel signal read from the normal pixel in the second read mode,
    extracts the OB pixel signal read from the OB pixel in the second read mode, and
    generates the pixel data by subtracting the OB pixel signal from the normal pixel signal and adding the OB pixel signal read from the OB pixel in the first read mode and arranges the generated pixel data to generate the second pixel data array.

5. The image pickup apparatus according to claim 4, wherein
the image sensor includes a first OB clamping circuit and a second OB clamping circuit,
the first OB clamping circuit performs OB clamping on the pixel signal read in the first read mode and performs OB clamping on the one pixel signal read in the second read mode, and
the second OB clamping circuit performs OB clamping on the (n−1) signals read in the second read mode.

6. The image pickup apparatus according to claim 1, wherein
the image sensor is a color image sensor in which color filters of a plurality of filter colors are arranged as repetition of a predetermined basic array so that one micro lens corresponds to one filter color, and
the first circuit performs the OB level correction processing for each filter color while distinguishing among the filter colors.

7. The image pickup apparatus according to claim 6, wherein
the predetermined basic array of the image sensor is a Bayer array.

8. An image pickup apparatus comprising:
an image sensor in which a plurality of pixels are arranged in a row direction and in a direction intersecting with the row direction, assuming that n is an integer equal to or greater than 2, each of the plurality of pixels including one micro lens and n photoelectric conversion elements, the image sensor being configured to output an image pickup signal relating to n divided pixel signals generated by performing photoelectric conversion on light from the micro lens by the n photoelectric conversion elements; and
an image processing circuit configured to perform image processing on the image pickup signal outputted from the image sensor, wherein
the image sensor can read the image pickup signal relating to the n divided pixel signals for each pixel row including a plurality of pixels arranged in the row direction in a first read mode or a second read mode,
the first read mode is a mode in which the n divided pixel signals are added to generate one pixel signal, and one pixel row is read in one row,
the second read mode is a mode in which n signals are generated from the n divided pixel signals, and one pixel row is read in n rows,
the image processing circuit comprises:
a first circuit configured to generate a first pixel data array from a pixel signal in a pixel row read in the first read mode, generate or extract one pixel signal from the n signals in a pixel row read in the second read mode to generate a second pixel data array having an arrangement order of pixel data that is a same as an arrangement order of pixel data of the first pixel data array and generate image data in which pixel data is arranged in a predetermined order for each pixel row; and
a second circuit configured to perform dark shading correction on the image data, and
the second circuit subtracts dark shading data in accordance with a pixel position from each piece of pixel data of the first pixel data array generated by the first circuit, and
subtracts data obtained by multiplying the dark shading data in accordance with the pixel position by n times from each piece of pixel data of the second pixel data array generated by the first circuit.

9. The image pickup apparatus according to claim 8, wherein
the image sensor includes an OB clamping circuit configured to set an OB level of the image pickup signal at an OB clamping level,
the image processing circuit includes a memory configured to store a shading image for correction, and
the second circuit reads the shading image for correction from the memory and subtracts the OB clamping level from the shading image for correction to generate the dark shading data.

10. An image pickup apparatus comprising:
an image sensor in which a plurality of pixels are arranged in a row direction and in a direction intersecting with the row direction, assuming that n is an integer equal to or greater than 4, each of the plurality of pixels including one micro lens and n photoelectric conversion elements, the plurality of pixels including a normal pixel that is not shaded and an OB pixel that is a shaded optical black pixel, the image sensor being configured to output an image pickup signal relating to n divided pixel signals generated by performing photoelectric conversion on light from the micro lens by the n photoelectric conversion elements; and
an image processing circuit configured to perform image processing on the image pickup signal outputted from the image sensor, wherein
the image sensor can read the image pickup signal relating to the n divided pixel signals for each pixel row including a plurality of pixels arranged in the row direction in a first read mode or a second read mode,
the first read mode is a mode in which the n divided pixel signals are added to generate one pixel signal, and one pixel row is read in one row,
the second read mode is a mode in which m ($2 \leq m < n$) signals are generated from the n divided pixel signals, and one pixel row is read in m rows,
the image pickup signal of the normal pixel is read in the first read mode and the second read mode, and the image pickup signal of the OB pixel is read in the first read mode and the second read mode,
the image processing circuit includes a first circuit configured to generate a first pixel data array from a pixel signal in a pixel row read in the first read mode, generate or extract one pixel signal from the m signals in a pixel row read in the second read mode to generate a second pixel data array having an arrangement order of pixel data that is a same as an arrangement order of pixel data of the first pixel data array and generate image data in which pixel data is arranged in a predetermined order for each pixel row, and
the first circuit performs OB level correction processing on a normal pixel signal generated or extracted from the m signals read from the normal pixel in the second read mode using an OB pixel signal generated or extracted from the m signals read from the OB pixel in the second read mode and an OB pixel signal read from the OB pixel in the first read mode.

11. The image pickup apparatus according to claim 10, wherein
the image sensor reads the m signals generated from the n divided pixel signals in m rows in the second read mode, and the first circuit generates an added normal pixel signal generated or extracted from the m signals read from the normal pixel in the second read mode, generates an added OB pixel signal generated or extracted from the m signals read from the OB pixel in the second read mode, and generates the pixel data by subtracting the added OB pixel signal from the added normal pixel signal and adding an OB pixel signal read from the OB pixel in the first read mode and arranges the generated pixel data to generate the second pixel data array.

12. The image pickup apparatus according to claim 11, wherein the image sensor includes a first OB clamping circuit and a second OB clamping circuit, the first OB clamping circuit performs OB clamping on the pixel signal read in the first read mode, and the second OB clamping circuit performs OB clamping on the m signals read in the second read mode.

13. The image pickup apparatus according to claim 10, wherein the image sensor reads one pixel signal obtained by adding the n divided pixel signals and (m−1) signals from which the m signals can be generated by being combined with the one pixel signal in m rows in the second read mode, and the first circuit extracts the normal pixel signal read from the normal pixel in the second read mode, extracts the OB pixel signal read from the OB pixel in the second read mode, and generates the pixel data by subtracting the OB pixel signal from the normal pixel signal and adding the OB pixel signal read from the OB pixel in the first read mode and arranges the generated pixel data to generate the second pixel data array.

14. The image pickup apparatus according to claim 13, wherein the image sensor includes a first OB clamping circuit and a second OB clamping circuit, the first OB clamping circuit performs OB clamping on the pixel signal read in the first read mode and performs OB clamping on the one pixel signal read in the second read mode, and the second OB clamping circuit performs OB clamping on the (m−1) signals read in the second read mode.

15. The image pickup apparatus according to claim 10, wherein the image sensor is a color image sensor in which color filters of a plurality of filter colors are arranged as repetition of a predetermined basic array so that one micro lens corresponds to one filter color, and the first circuit performs the OB level correction processing for each filter color while distinguishing among the filter colors.

16. The image pickup apparatus according to claim 15, wherein the predetermined basic array of the image sensor is a Bayer array.

17. The image pickup apparatus according to claim 11, wherein the image processing circuit includes a second circuit configured to perform dark shading correction on the image data, and the second circuit subtracts dark shading data in accordance with a pixel position from each piece of pixel data of the first pixel data array generated by the first circuit, and subtracts data obtained by multiplying the dark shading data in accordance with the pixel position by m times from each piece of pixel data of the second pixel data array generated by the first circuit.

18. The image pickup apparatus according to claim 17, wherein the image sensor includes an OB clamping circuit configured to set an OB level of the image pickup signal at an OB clamping level, the image processing circuit includes a memory configured to store a shading image for correction, and the second circuit reads the shading image for correction from the memory and subtracts the OB clamping level from the shading image for correction to generate the dark shading data.

* * * * *